(12) United States Patent
Cho et al.

(10) Patent No.: US 11,881,519 B2
(45) Date of Patent: *Jan. 23, 2024

(54) SEMICONDUCTOR DEVICE

(71) Applicant: SAMSUNG ELECTRONICS CO., LTD., Suwon-si (KR)

(72) Inventors: Nam Gyu Cho, Seoul (KR); Rak Hwan Kim, Suwon-si (KR); Hyeok-Jun Son, Seoul (KR); Do Sun Lee, Suwon-si (KR); Won Keun Chung, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/826,380

(22) Filed: May 27, 2022

(65) Prior Publication Data
US 2022/0285518 A1 Sep. 8, 2022

Related U.S. Application Data

(63) Continuation of application No. 17/015,296, filed on Sep. 9, 2020, now Pat. No. 11,349,007.

(30) Foreign Application Priority Data
Jan. 7, 2020 (KR) .................. 10-2020-0001796

(51) Int. Cl.
H01L 29/49 (2006.01)
H01L 29/06 (2006.01)
(Continued)

(52) U.S. Cl.
CPC .... *H01L 29/4983* (2013.01); *H01L 21/28132* (2013.01); *H01L 21/31111* (2013.01);
(Continued)

(58) Field of Classification Search
CPC .......... H01L 29/4983; H01L 21/28132; H01L 21/31111; H01L 29/0673; H01L 29/42392; H01L 29/4908; H01L 29/6653; H01L 29/66553; H01L 29/66742; H01L 29/78696; H01L 21/28562;
(Continued)

(56) References Cited

U.S. PATENT DOCUMENTS 8,906,754 B2 12/2014 Pham et al.
9,722,038 B2 8/2017 Adusumilli et al.
(Continued)

Primary Examiner — Tong-Ho Kim
(74) Attorney, Agent, or Firm — Muir Patent Law, PLLC

(57) ABSTRACT

A semiconductor device and a method of fabricating a semiconductor device, the device including a fin-type pattern extending in a first direction; a gate electrode extending in a second direction over the fin-type pattern, the second direction being different from the first direction; spacers on sidewalls of the gate electrode; a capping structure on the gate electrode and the spacers, the capping structure including a first capping pattern and a second capping pattern, the second capping pattern being on the first capping pattern; and an interlayer insulating film surrounding sidewalls of each of the spacers and sidewalls of the capping structure, the interlayer insulating film being in contact with the first capping pattern.

18 Claims, 54 Drawing Sheets

(51) Int. Cl.
*H01L 29/423* (2006.01)
*H01L 29/66* (2006.01)
*H01L 21/28* (2006.01)
*H01L 21/311* (2006.01)
*H01L 29/786* (2006.01)

(52) U.S. Cl.
CPC .... *H01L 29/0673* (2013.01); *H01L 29/42392* (2013.01); *H01L 29/4908* (2013.01); *H01L 29/6653* (2013.01); *H01L 29/66553* (2013.01); *H01L 29/66742* (2013.01); *H01L 29/78696* (2013.01)

(58) Field of Classification Search
CPC ......... H01L 21/28114; H01L 21/76804; H01L 29/0653; H01L 21/76834; H01L 21/76865; H01L 23/53266; H01L 21/76849; H01L 21/76897; H01L 29/775; H01L 29/42376; H01L 29/4966; H01L 29/513; H01L 29/6656; H01L 29/66545; H01L 29/785; H01L 21/28008; H01L 21/823431; B82Y 10/00

USPC ....................................................... 257/347
See application file for complete search history.

(56) References Cited

U.S. PATENT DOCUMENTS

| | | | |
|---|---|---|---|
| 9,748,248 | B2 | 8/2017 | Kang |
| 9,761,683 | B2 | 9/2017 | Chou et al. |
| 10,032,890 | B2 | 7/2018 | Yim et al. |
| 10,141,225 | B2 | 11/2018 | Tsai et al. |
| 10,164,039 | B2 | 12/2018 | Liou et al. |
| 10,304,684 | B2 | 5/2019 | Jang et al. |
| 11,349,007 | B2* | 5/2022 | Cho ..................... H01L 29/6656 |
| 2014/0332883 | A1* | 11/2014 | Kwon ................. H01L 27/0266 |
| | | | 257/336 |
| 2017/0186844 | A1 | 6/2017 | Kim et al. |
| 2017/0200738 | A1* | 7/2017 | Kim .................. H01L 29/78696 |
| 2017/0317076 | A1* | 11/2017 | Shen .................. H01L 27/0886 |
| 2018/0261507 | A1 | 9/2018 | Jacobi et al. |
| 2019/0341461 | A1* | 11/2019 | Wang ............... H01L 29/66795 |
| 2020/0075720 | A1 | 3/2020 | Cheng et al. |

* cited by examiner

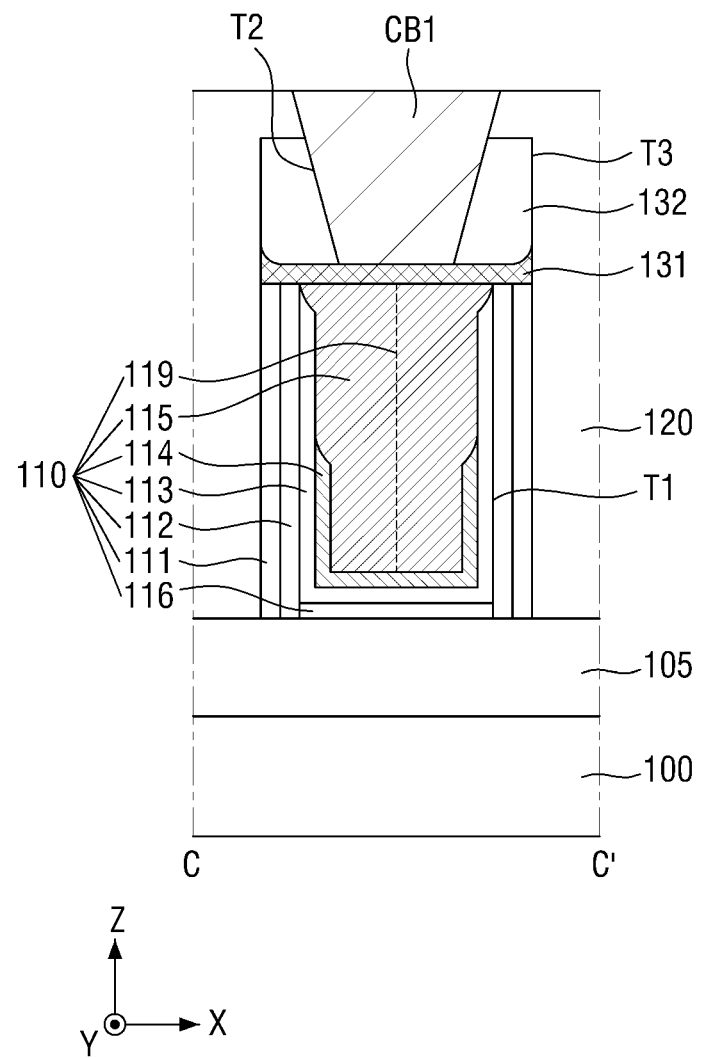

SEMICONDUCTOR DEVICE

CROSS-REFERENCE TO RELATED APPLICATIONS

This is a continuation application based on pending application Ser. No. 17/015,296, filed Sep. 9, 2020, the entire contents of which is hereby incorporated by reference.

Korean Patent Application No. 10-2020-0001796, filed on Jan. 7, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Semiconductor devices have become highly integrated and the length of channels has decreased.

SUMMARY

The embodiments may be realized by providing a semiconductor device including a fin-type pattern extending in a first direction; a gate electrode extending in a second direction over the fin-type pattern, the second direction being different from the first direction; spacers on sidewalls of the gate electrode; a capping structure on the gate electrode and the spacers, the capping structure including a first capping pattern and a second capping pattern, the second capping pattern being on the first capping pattern; and an interlayer insulating film surrounding sidewalls of each of the spacers and sidewalls of the capping structure, the interlayer insulating film being in contact with the first capping pattern.

The embodiments may be realized by providing a semiconductor device including a fin-type pattern extending in a first direction; a gate electrode extending in a second direction over the fin-type pattern, the second direction being different from the first direction; spacers on sidewalls of the gate electrode; a capping structure on at least parts of top surfaces of the spacers and on a top surface of the gate electrode, the capping structure including a first capping pattern and a second capping pattern, the second capping pattern being on the first capping pattern; and an interlayer insulating film surrounding sidewalls of each of the spacers and sidewalls of the capping structure.

The embodiments may be realized by providing a semiconductor device including nanosheets; a gate electrode surrounding the nanosheets; spacers on sidewalls of the gate electrode; a capping structure on the gate electrode and the spacers, the capping structure including a first capping pattern and a second capping pattern, the second capping pattern being on the first capping pattern, the first capping pattern including a conductive material and the second capping patterns including an insulating material; and an interlayer insulating film surrounding sidewalls of each of the spacers and sidewalls of the capping structure, the interlayer insulating film being in contact with the first capping pattern.

The embodiments may be realized by providing a method of fabricating a semiconductor device, the method including forming a fin-type pattern on a substrate such that the fin-type pattern extends in a first direction; forming pre-spacers on the fin-type pattern, the pre-spacers defining a gate trench that extends in a second direction, which is different from the first direction; forming a pre-gate electrode that fills the gate trench; forming a gate electrode by recessing part of the pre-gate electrode; forming spacers by etching parts of the pre-spacers; forming a first capping pattern along top surfaces of the spacers and a top surface of the gate electrode such that the first capping pattern includes a conductive material; and forming a second capping pattern on the first capping pattern such that the second capping pattern includes a material different from the first capping pattern.

BRIEF DESCRIPTION OF THE DRAWINGS

Features will be apparent to those of skill in the art by describing in detail exemplary embodiments with reference to the attached drawings in which:

FIG. 4A is a cross-sectional view taken along line C-C' of FIG. 1;

DETAILED DESCRIPTION

In the accompanying drawings of each semiconductor device according to some embodiments of the present disclosure, a fin-type field-effect transistor (FinFET) including fin-type channel regions and a multi-bridge-channel field-effect transistor (MBCFET™) including nanosheets are illustrated as examples, but the present disclosure is not limited thereto. That is, each semiconductor device according to some embodiments of the present disclosure may include a tunneling field-effect transistor (FET). Also, each semiconductor device according to some embodiments of the present disclosure may include a three-dimensional (3D) transistor or may include lateral double diffused metal oxide semiconductor transistor (LDMOS).

Embodiments of the present disclosure will hereinafter be described with reference to the accompanying drawings.

Figure 1:
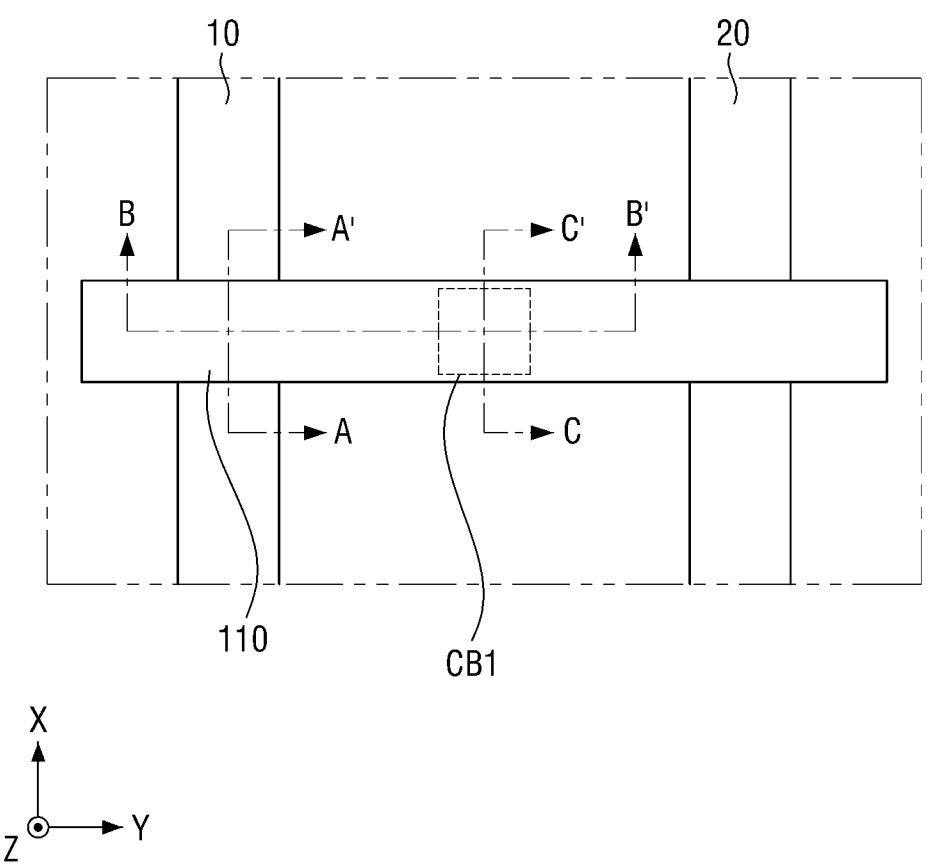
FIG. 1 is a plan view of a semiconductor device according to some embodiments of the present disclosure.
Figure 2:
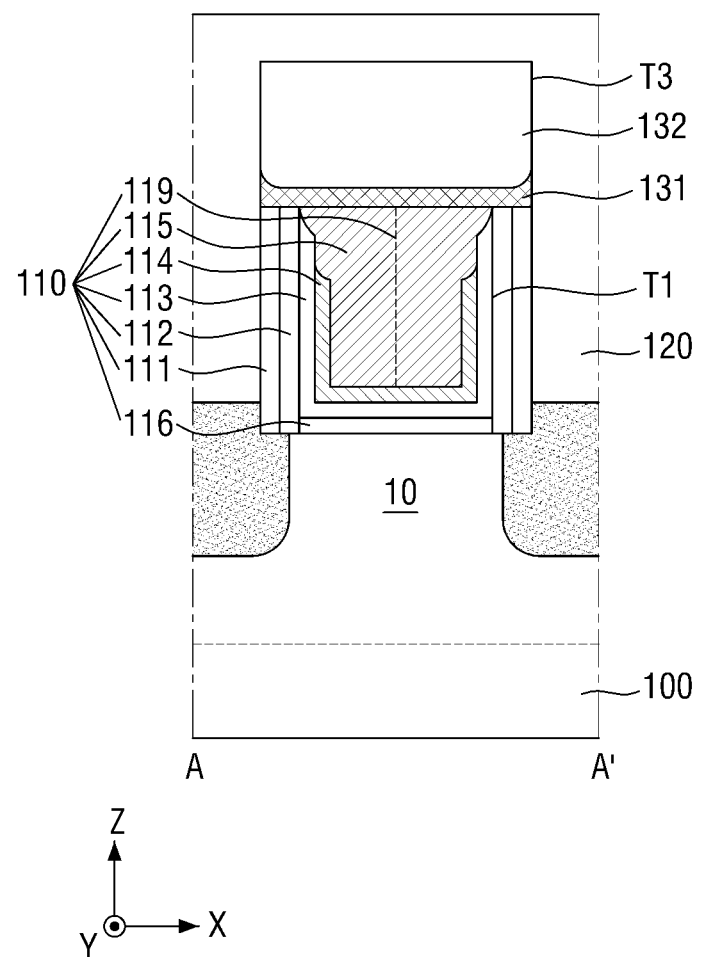
FIG. 2 is a cross-sectional view taken along line A-A' of FIG. 1.
Figure 3:
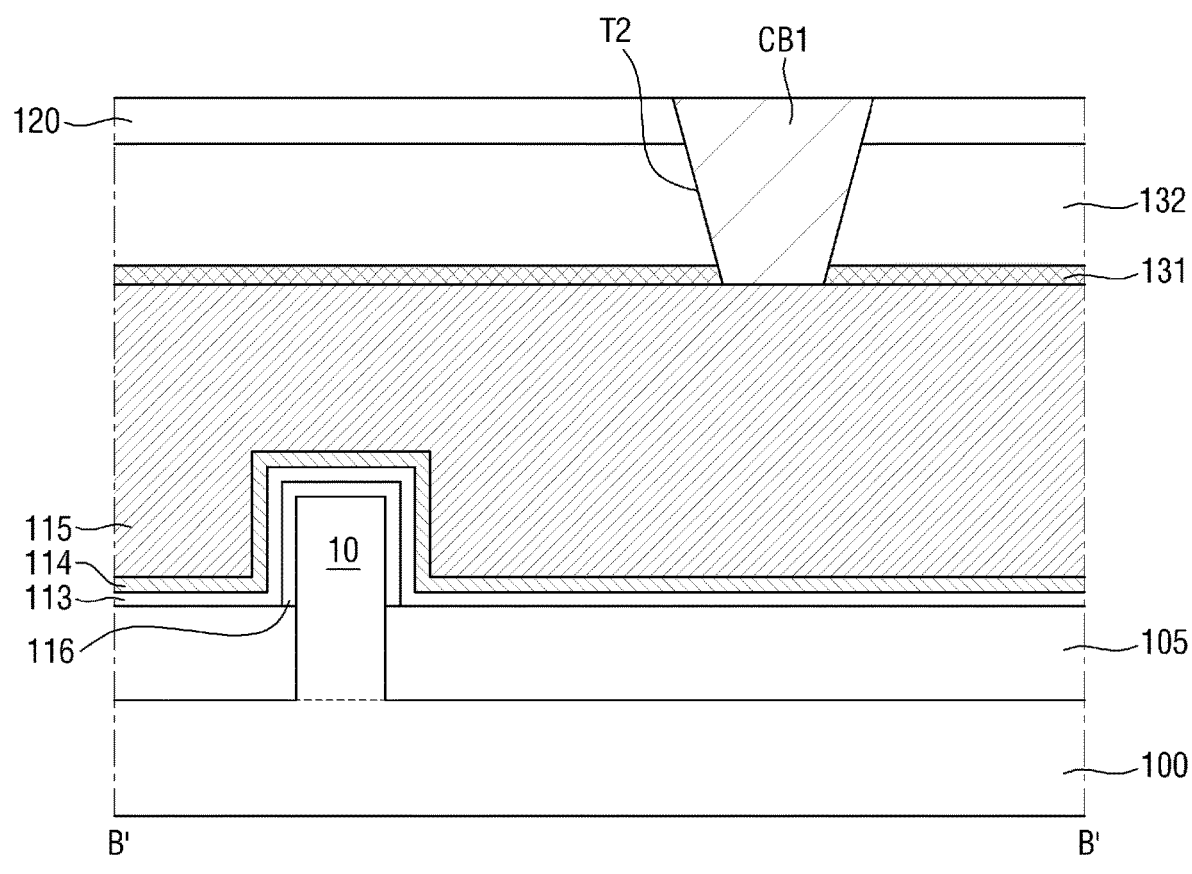
FIG. 3 is a cross-sectional view taken along line B-B' of FIG. 1.

FIG. 1 is a plan view of a semiconductor device according to some embodiments of the present disclosure. FIG. 2 is a cross-sectional view taken along line A-A' of FIG. 1. FIG. 3 is a cross-sectional view taken along line B-B' of FIG. 1. FIG. 4A is a cross-sectional view taken along line C-C' of FIG. 1.

For convenience, FIG. 1 illustrates only a first fin-type pattern 10, a second fin-type pattern 20, and a gate structure 110 and illustrates a first gate contact CB1 as being disposed between the first and second fin-type patterns 10 and 20.

Referring to FIGS. 1 through 4A, the semiconductor device may include a substrate 100, a first fin-type pattern 10, a second fin-type pattern 20, a field insulating film 105, a gate structure 110, an interlayer insulating film 120, a first capping pattern 131, a second capping pattern 132, source/drain regions 151 (see FIG. 12), and a first gate contact CB1.

The substrate 100 may be a bulk silicon substrate or a silicon-on-insulator (SOI) substrate. In an implementation, the substrate 100 may be a silicon substrate or may include a material other than silicon, e.g., silicon germanium, silicon germanium-on-insulator (SGOI), indium antimonide, lead tellurium compound, indium arsenide, indium phosphide, gallium arsenide, or gallium antimonide. As used herein, the term "or" is not an exclusive term, e.g., "A or B" would include A, B, or A and B.

For convenience, the substrate 100 will hereinafter be described as being a substrate including silicon.

The first and second fin-type patterns 10 and 20 may be defined by the field insulating film 105. The first and second fin-type patterns 10 and 20 may be spaced apart from each other, or may be adjacent to each other.

The first fin-type pattern 10 may extend (e.g., lengthwise) in a first direction X over or on the substrate 100. The second fin-type pattern 20 may be spaced apart from the first fin-type pattern 10 in a second direction Y (e.g., crossing the first direction X) and may extend in the first direction X on the substrate 100.

In an implementation, each of the first and second fin-type patterns 10 and 20 may have a rectangular shape that extends in the first direction X. The first and second fin-type patterns 10 and 20 may be arranged side-by-side to adjoin each other in the direction of the long sides thereof.

The field insulating film 105 may surround the first and second fin-type patterns 10 and 20. The field insulating film 105 will hereinafter be described as referring to a region between the first and second fin-type patterns 10 and 20.

The field insulating film 105 may be between the first and second fin-type patterns 10 and 20 and may be in direct contact with the first and second fin-type patterns 10 and 20.

The field insulating film 105 may include, e.g., a silicon oxide film, a silicon nitride film, a silicon oxynitride film, or a combination thereof.

The field insulating film 105 may further include at least one field liner film, which is formed between the first fin-type pattern 10 and the field insulating film 105 and between the second fin-type pattern 20 and the field insulating film 105.

In a case where the field insulating film 105 further includes a field liner film, the field liner film may include, e.g., polysilicon, amorphous silicon, silicon oxynitride (SiON), silicon nitride (SiN), or silicon oxide (SiO2).

The gate structure 110 may extend in the second direction Y, which intersects the first direction X, on the first fin-type pattern 10.

The gate structure 110 may include first spacers 111, second spacers 112, a gate insulating film 113, a metal film 114, a filling film 115, and an interface film 116.

The gate structure 110 may be formed by sequentially stacking the interface film 116, the gate insulating film 113, the metal film 114, and the filling film 115 in a first recess T1, which is defined by the first spacers 111 and the second spacers 112.

The top surface of the gate structure 110 may be on a lower plane than the top surface of the interlayer insulating film 120 with respect to the substrate 100 (e.g., in a vertical or third direction Z).

The interface film 116 may be on the first fin-type pattern 10. The first interface film 116 may be at the bottom of the first recess T1. In an implementation, as illustrated in the drawings, the first interface film 116 may not be formed on the sidewalls of the first recess T1. In an implementation, the interface film 116 may be on the sidewalls of the first recess T1 depending on how the interface film 116 is formed.

The interface film 116 may include, e.g., silicon oxide ($SiO_2$). In an implementation, the interface film 116 may include various materials other than silicon oxide ($SiO_2$) depending on the types of the substrate 100 and the gate insulating film 113.

The first spacers 111 and the second spacers 112 may be on the substrate 100 and may be sequentially on the sidewalls of the first recess T1.

In an implementation, as illustrated in the drawings, the first spacers 111 and the second spacers 112 may have a multilayer structure. In an implementation, the first spacers 111 and the second spacers 112 may be formed as single layers.

The first spacers 111 and the second spacers 112 may each independently include, e.g., silicon nitride (SiN), silicon oxynitride (SiON), silicon oxide (SiO$_2$), silicon oxycarbonitride (SiOCN), or a combination thereof.

At least one of the films included in the first spacers 111 or the second spacers 112 may include a low-k material such as silicon oxycarbonitride (SiOCN). In an implementation, the first spacers 111 and the second spacers 112 may include different materials.

In an implementation, the first spacers 111 may have a rectilinear shape, or may have an "L" shape.

The first spacers 111 and the second spacers 112 may serve as guides for forming a self-aligned contact. Accordingly, the first spacers 111 and the second spacers 111 may include a material having etching selectivity with respect to the interlayer insulating film 120 that will be described later.

The first recess T1 may be defined by or may accommodate the second spacers 112 and may be formed on the first fin-type pattern 10. The first recess T1 may, e.g., have the second spacers 112 as its sidewalls and the top surface of the first fin-type pattern 10 as its bottom. In an implementation, the second spacers 112 may extend along the sidewalls of the first recess T1.

A second recess T2 may be defined by or may accommodate the first gate contact CB1 and may be formed on or in the first and second capping patterns 131 and 132 that will be described in greater detail below. The second recess T2 may, e.g., have the first gate contact CB1 as or at its sidewalls and the top surface of the first capping pattern 131 as its bottom.

The second recess T2 may be between the first and second fin-type patterns 10 and 20, on the gate structure 110.

A third recess T3 may be defined by or in the interlayer insulating film 120 and may be formed on the gate structure 110. The third recess T3 may, e.g., have the interlayer insulating film 120 as its sidewalls and the top surface of the gate structure 110 as its bottom. In an implementation, the gate structure 110 may extend along or be aligned with the sidewalls of the third recess T3.

The gate insulating film 113 may be on the interface film 116. The gate insulating film 113 may be along the top surface of the interface film 116 and the sidewalls of the first recess T1.

In an implementation, the gate insulating film 113 may be a single layer, or the gate insulating film 113 may include multiple layers.

In an implementation, the gate insulating film 113 may be formed conformally along parts of the top surfaces of the second spacers 112 and along the interface film 116, or may form inclined structures, at both ends thereof, that become thicker closer to the second spacers 112.

The gate insulating film 113 may include, e.g., a high-k material. In an implementation, the high-k material may include, e.g., a high-k silicate, a high-k oxynitride, or a high-k silicon oxynitride containing scandium (Sc), yttrium (Y), titanium (Ti), tantalum (Ta), or lanthanum (La).

The metal film 114 may be on the gate insulating film 113, in the first recess T1. In an implementation, the metal film 114 may cover only part of the surface of the gate insulating film 113, or the metal film 114 may cover the entire top or inner surface of the gate insulating film 113.

The metal film 114 may have a thickness of 1 nm to 4 nm. In an implementation, the metal film 114 may be formed conformally along part of the top surface of the gate insulating film 113, or may form inclined structures, at both ends thereof, that become thicker closer to the gate insulating film 113.

The metal film 114 may include a third concentration of silicon (Si). The metal film 114 may include a high-k material.

The metal film 114 may include, e.g., a metal nitride, a metal oxynitride, a metal carbide, a metal oxycarbide, or a metal oxynitride carbide containing titanium (Ti) or tantalum (Ta).

In an implementation, the metal film 114 may be a single layer, or the metal film 114 may include multiple layers.

The filling film 115 may be on the metal film 114 to fill the first recess T1.

The filling film 115 may include, e.g., tungsten (W), aluminum (Al), cobalt (Co), copper (Cu), ruthenium (Ru), nickel (Ni), platinum (Pt), or nickel-platinum (Ni—Pt).

In an implementation, the filling film 115 may be a single layer, or the filling film 115 may include multiple layers.

The gate insulating film 113, the metal film 114, and the filling film 115 may be included in a gate electrode (113, 114, and 115), and the metal film 114 and the filling film 115 may include a seam structure 119 therein.

The seam structure 119 may denote an empty space in the gate electrode (113, 114, and 115) and may also be referred to as a void, an air gap, or the like.

In an implementation, referring to FIG. 2, the seam structure 119 may be at a center of the filling film 115. In an implementation, the seam structure 119 may be formed in an arbitrary space in the metal film 114 and in the filling film 115, and only one, or more than one, seam structure 119 may be formed.

The interlayer insulating film 120 may be on the substrate 100. The interlayer insulating film 120 may surround the outer sides of the first spacers 111 and may also surround a capping structure including the first and second capping patterns 131 and 132. As mentioned above, the interlayer insulating film 120 may form the third recess T3 together with the top surface of the gate structure 110.

The interlayer insulating film 120 may include, e.g., silicon oxide (SiO$_2$), silicon nitride (SiN), silicon oxynitride (SiON), flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PE-TEOS), fluoride Silicate glass (FSG), carbon-doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof.

In an implementation, the interlayer insulating film 120 may be a single layer, or the interlayer insulating film 120 may include multiple layers to adjust the profile of the first recess T1.

The first capping pattern 131 may be at the bottom of the third recess T3. In an implementation, the first capping pattern 131 may be in contact (e.g., direct contact) with the first spacers 111, the second spacers 112, and the gate electrode (113, 114, and 115) and may also be in contact (e.g., direct contact) with the interlayer insulating film 120. In an implementation, the first capping pattern 131 may not extend between the second capping pattern 132 and the interlayer insulating film 120 (e.g., may not completely separate the sidewalls of the second capping pattern 132 from the interlayer insulating film 120).

The first capping pattern 131 may be formed conformally along the top surface of the gate structure 110, or may form inclined structures, at both ends thereof, that become thicker closer to the interlayer insulating film 120.

In an implementation, the first capping pattern 131 may be formed to a thickness of, e.g., 1 nm to 5 nm. In an implementation, the thickness of the first capping pattern 131 may be at least the same as, or smaller than, the thickness of the second capping pattern 132.

In an implementation, the first capping pattern 131 may include a conductive material e.g., TiN/TiON/TaN/W/Co or a combination thereof.

The second capping pattern 132 may be on the first capping pattern 131 to form or fill the rest of the third recess T3 and may cover the uppermost part of the first capping pattern 131 (e.g., the part of the first capping pattern 131 that is distal to the substrate 100 in the vertical direction Z). In an implementation, the top surface of the second capping pattern 132 may be on a same plane as the bottom surface of the interlayer insulating film 120 and may be in contact with the sidewalls of the third recess T3. In an implementation, the second capping pattern 132 may be in contact (e.g., direct contact) with the interlayer insulating film 120.

The second capping pattern 132 may serve as a guide for forming a self-aligned contact, and the second capping pattern 132 may include a material having etching selectivity with respect to the interlayer insulating film 120. The second capping pattern 132 may include an insulating material, e.g., silicon nitride (SiN), silicon oxynitride (SiON), silicon oxide (SiO$_2$), silicon carbonitride (SiCN), silicon oxycarbonitride (SiOCN), or a combination thereof.

The first capping pattern 131 and the second capping pattern 132 on the first capping pattern 131 may be the capping structure, and the interlayer insulating film 120 may surround the sidewalls of the capping structure.

The first gate contact CB1 may be on the gate structure 110, between the first and second fin-type patterns 10 and 20. The first gate contact CB1 may be on the sidewalls of the second recess T2.

The first gate contact CB1 may penetrate the second capping pattern 132 and may be in contact (e.g., direct contact) with the first capping pattern 131. In an implementation, part of the first capping pattern 131 may be between the bottom surface of the first gate contact CB1 and the gate electrode (113, 114, and 115), and the gate contact CB1 may not be in contact with the gate electrode (113, 114, and 115).

In an implementation, the gate contact CB1 may include, e.g., tungsten (W).

A semiconductor device according to some embodiments of the present disclosure will hereinafter be described with reference to FIG. 4B, focusing mainly on the differences with the semiconductor device of FIGS. 2 through 4A.

Figure 4B:
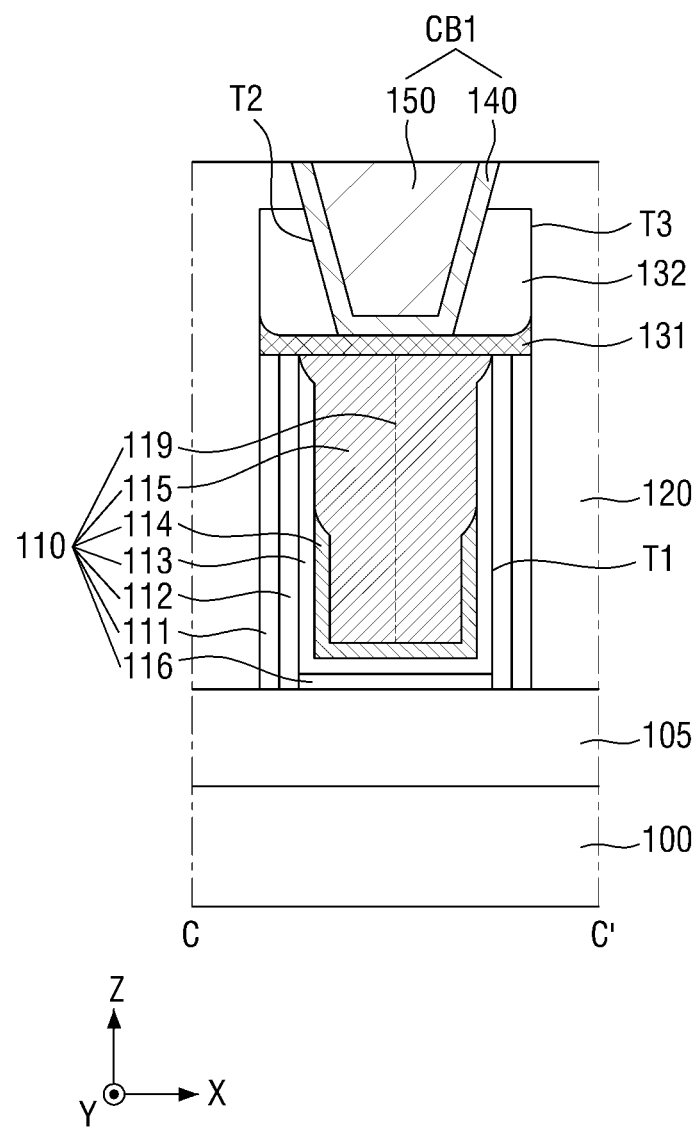
FIG. 4B is a cross-sectional view, taken along line C-C' of FIG. 1, of a semiconductor device according to some embodiments of the present disclosure.

FIG. 4B is a cross-sectional view, taken along line C-C' of FIG. 1, of a semiconductor device according to some embodiments of the present disclosure.

Referring to FIG. 4B, a gate contact CB1 may include a contact barrier layer 140 and a contact core layer 150. The contact barrier layer 140 may have a "U"-shaped longitudinal cross-section and may surround the bottom and the sides of the contact core layer 150. The contact barrier layer 140 may include, e.g., titanium (Ti), titanium nitride (TiN), tantalum (Ta), tantalum nitride (TaN), titanium tungsten (TiW), or another barrier metal.

The contact core layer 150 may include, e.g., tungsten (W).

A semiconductor device according to some embodiments of the present disclosure will hereinafter be described with reference to FIG. 5A, focusing mainly on the differences with the semiconductor device of FIGS. 2 through 4A.

Figure 5A:
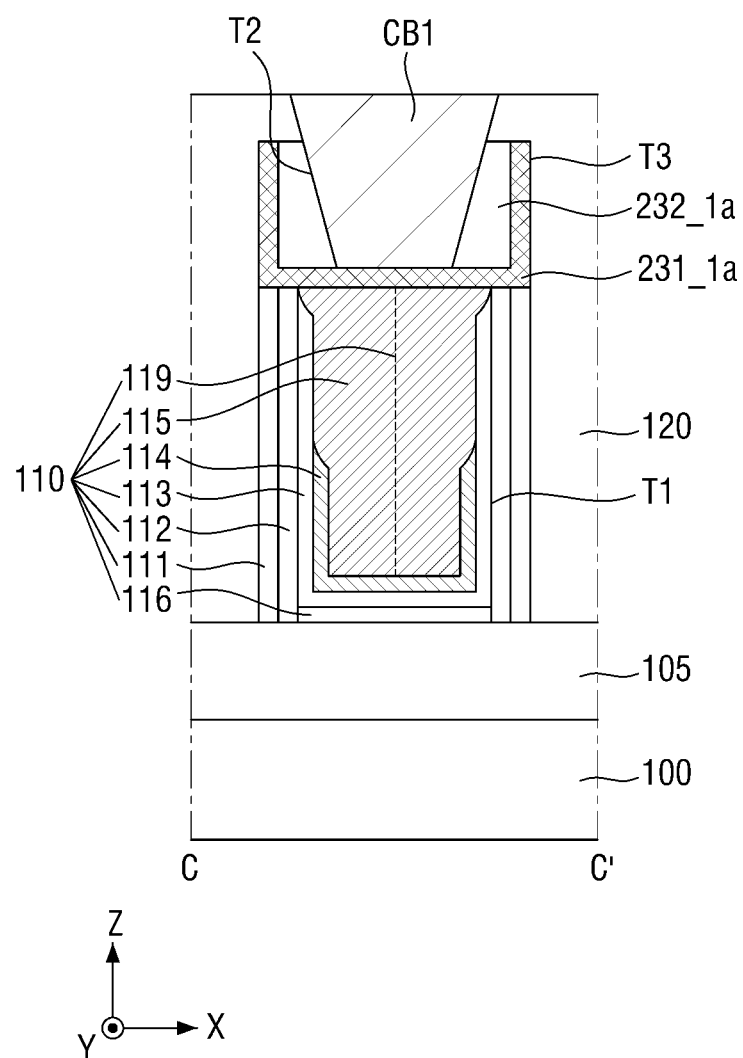
FIG. 5A is a cross-sectional view, taken along line C-C' of FIG. 1, of a semiconductor device according to some embodiments of the present disclosure.

FIG. 5A is a cross-sectional view, taken along line C-C' of FIG. 1, of a semiconductor device according to some embodiments of the present disclosure.

Referring to FIG. 5A, first and second capping patterns 231_1a and 232_1a may include the same materials as the first and second capping patterns 131 and 132, respectively, of FIG. 2.

Part of the first capping pattern 231_1a may extend between the second capping pattern 232_1a and an interlayer insulating film 120. As illustrated in FIG. 5A, the first capping pattern 231_1a may extend between the second capping pattern 232_1a and the interlayer insulating film 120 so that the uppermost surface of the first capping pattern 231_1a may be in contact with the interlayer insulating film 120. The first capping pattern 232_1a may be formed conformally (e.g., in the third trench T3).

The sidewalls of the second capping pattern 232_1a may not be in contact with the interlayer insulating film 120 (e.g., may be spaced apart from the interlayer insulating film in the first direction X by the first capping pattern 231_1a therebetween).

Semiconductor devices according to some embodiments of the present disclosure will hereinafter be described with reference to FIGS. 5B through 5D, focusing mainly on the differences with the semiconductor device of FIG. 5A.

Figure 5B:
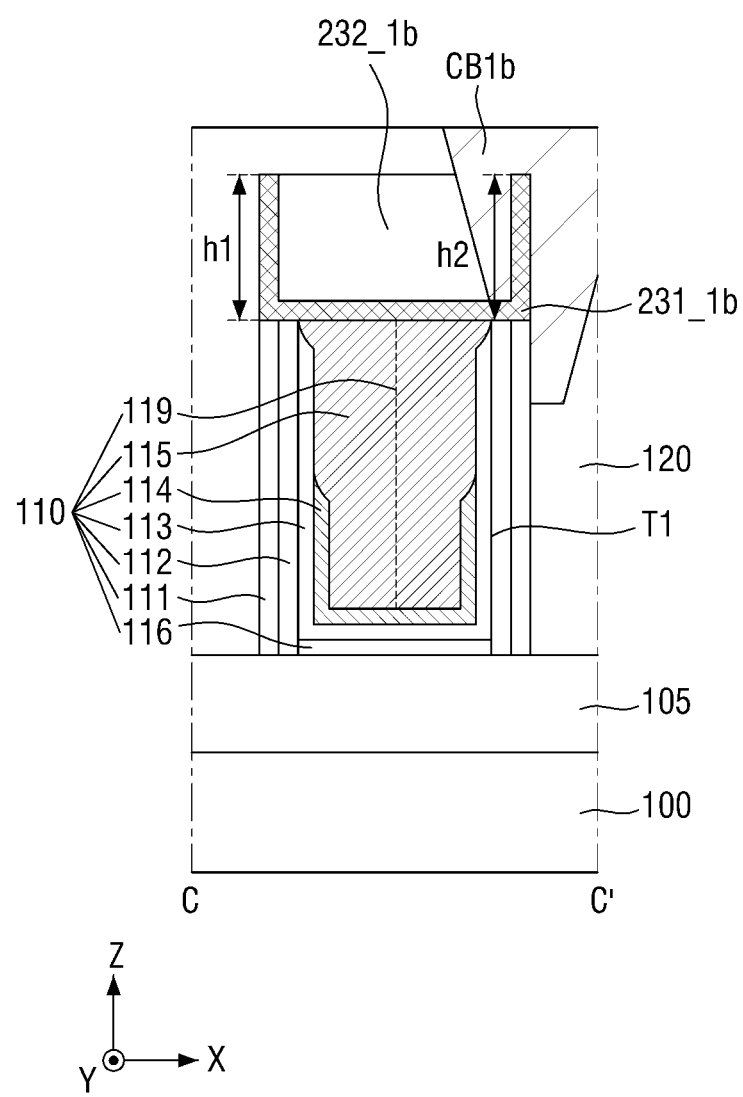
FIGS. 5B through 5D are cross-sectional views, taken along line C-C' of FIG. 1, of semiconductor devices according to some embodiments of the present disclosure.
Figure 5C:
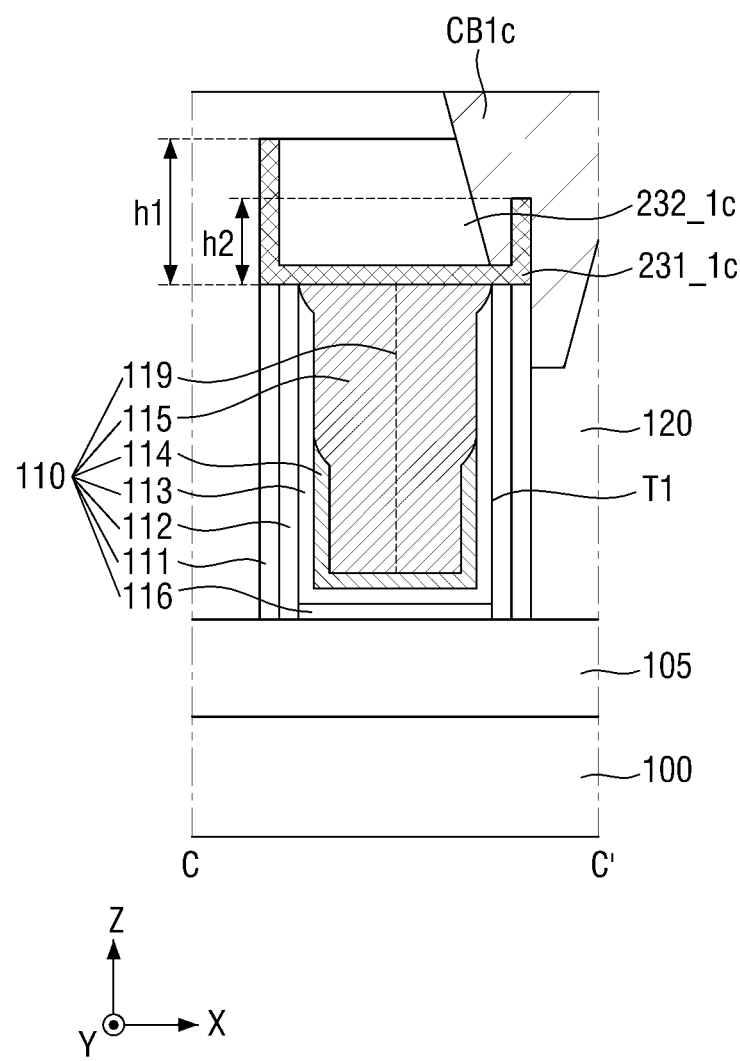
Figure 5D:
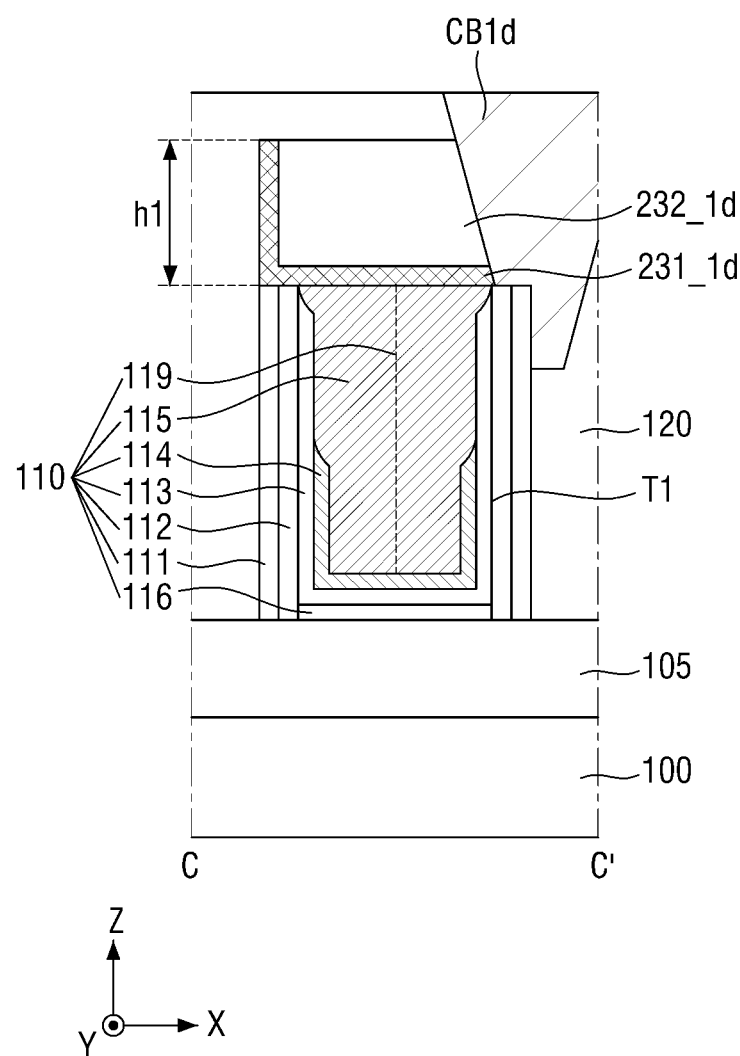

FIGS. 5B through 5D are cross-sectional views, taken along line C-C' of FIG. 1, of semiconductor devices according to some embodiments of the present disclosure.

Referring to FIGS. 5A and 5B, a first contact CB1b, unlike the first contact CB1 of FIG. 5A, may be formed not to be aligned with the center of a gate structure 110 and may be in contact with one outer sidewall of a first capping pattern 231_1b.

A height h1 (in the vertical direction Z) of the first capping pattern 231_1b at one end of the first capping pattern 231_1b where the first capping pattern 231_1b and the first contact CB1b are not in contact with each other may be the same as a height h2 of the first capping pattern 231_1b at the other end of the first capping pattern 231_1b where the first capping pattern 231_1b and the first contact CB1b are in contact with each other.

Referring to FIGS. 5A and 5C, a first contact CB1c, unlike the first contact CB1 of FIG. 5A, may be formed not to be aligned with the center of a gate structure 110 and may be in contact (e.g., direct contact) with one outer sidewall of a first capping pattern 231_1c, and the outer sidewall of the first capping pattern 231_1c that the first contact CB1c is in contact with may be further etched than the other outer sidewall of the first capping pattern 231_1c that the first contact CB1c is not in contact with.

A height h1 (e.g., in the vertical direction Z) of the first capping pattern 231_1c at one end of the first capping pattern 231_1c where the first capping pattern 231_1c and the first contact CB1c are not in contact with each other may be greater than a height h2 of the first capping pattern 231_1c at the other end of the first capping pattern 231_1c where the first capping pattern 231_1c and the first contact CB1c are in contact with each other.

Referring to FIGS. 5A and 5D, a first contact CB1d, unlike the first contact CB1 of FIG. 5A, may be formed not to be aligned with the center of a gate structure 110, and one outer sidewall of a first capping pattern 231_1d may be etched away so that the first contact CB1d may be in contact (e.g., direct contact) with the top surfaces of first and second spacers 111 and 112.

The top surface of the first capping pattern 231_1d at one end of the first capping pattern 231_1d where the first capping pattern 231_1*d* and the first contact CB1*d* are not in contact with each other may be higher (e.g., in the vertical direction Z) than the top surfaces of the first and second spacers 111 and 112 that the first contact CB1*d* is in contact with.

A semiconductor device according to some embodiments of the present disclosure will hereinafter be described with reference to FIG. 6, focusing mainly on the differences with the semiconductor device of FIG. 5A.

Figure 6:
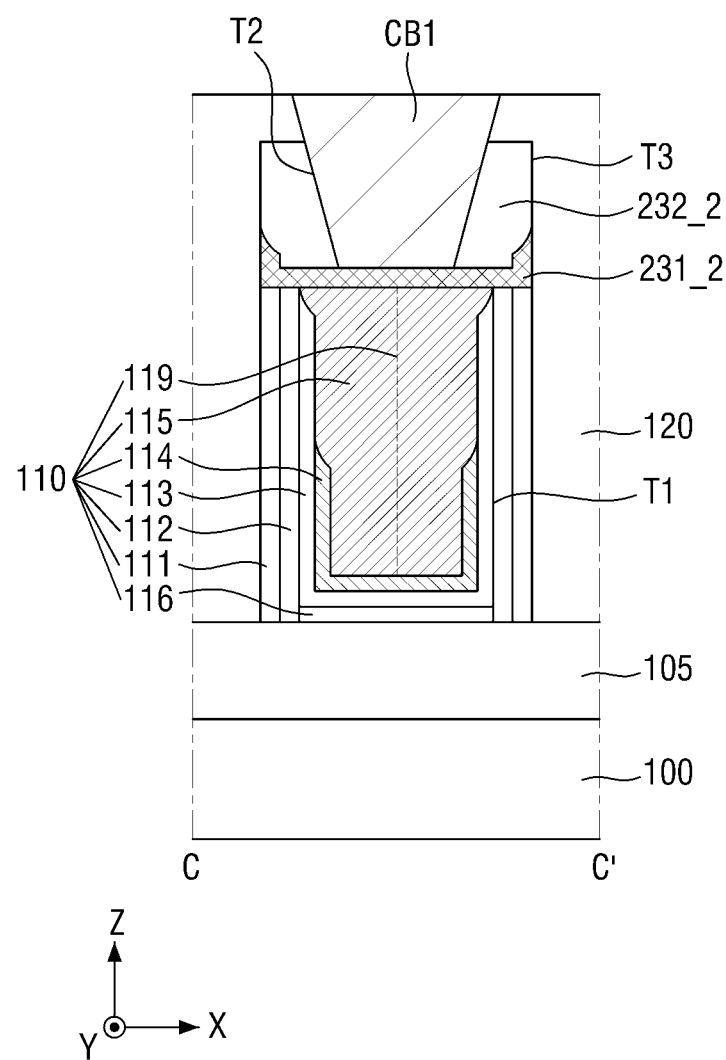
FIG. 6 is a cross-sectional view, taken along line C-C' of FIG. 1, of a semiconductor device according to some embodiments of the present disclosure.

FIG. 6 is a cross-sectional view, taken along line C-C' of FIG. 1, of a semiconductor device according to some embodiments of the present disclosure.

Referring to FIG. 6, part of a first capping pattern 231_2 may extend (e.g., in the vertical direction Z) to be between a second capping pattern 232_2 and an interlayer insulating film 120 (e.g., in the first direction X). In an implementation, in the embodiment of FIG. 6, unlike in the embodiment of FIG. 5, the uppermost surface of the first capping pattern 231_2 is not in contact with the interlayer insulating film 120.

The first capping pattern 231_2 may be formed conformally along the top surface of a gate structure 110, and may form inclined structures, at both ends thereof, that become thicker closer to the interlayer insulating film 120.

A semiconductor device according to some embodiments of the present disclosure will hereinafter be described with reference to FIGS. 7 and 8, focusing mainly on the differences with the semiconductor device of FIGS. 2 through 4A.

Figure 7:
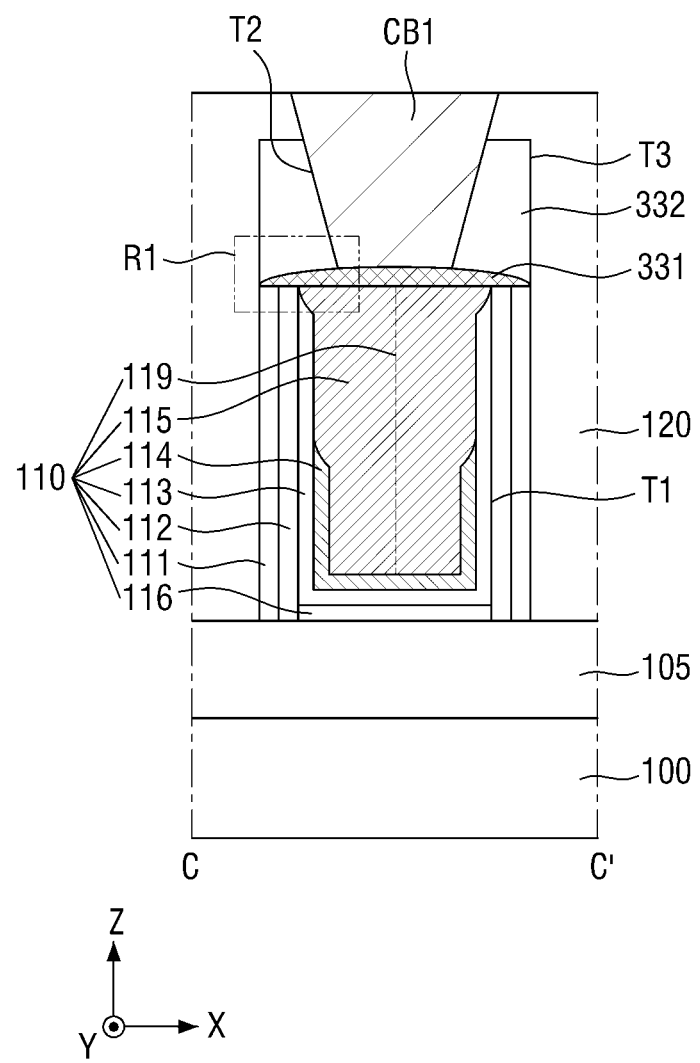
FIG. 7 is a cross-sectional view, taken along line C-C' of FIG. 1, of a semiconductor device according to some embodiments of the present disclosure.

FIG. 7 is a cross-sectional view, taken along line C-C' of FIG. 1, of a semiconductor device according to some embodiments of the present disclosure. FIG. 8 is an enlarged cross-sectional view illustrating a part R1 of FIG. 7.

Figure 8:
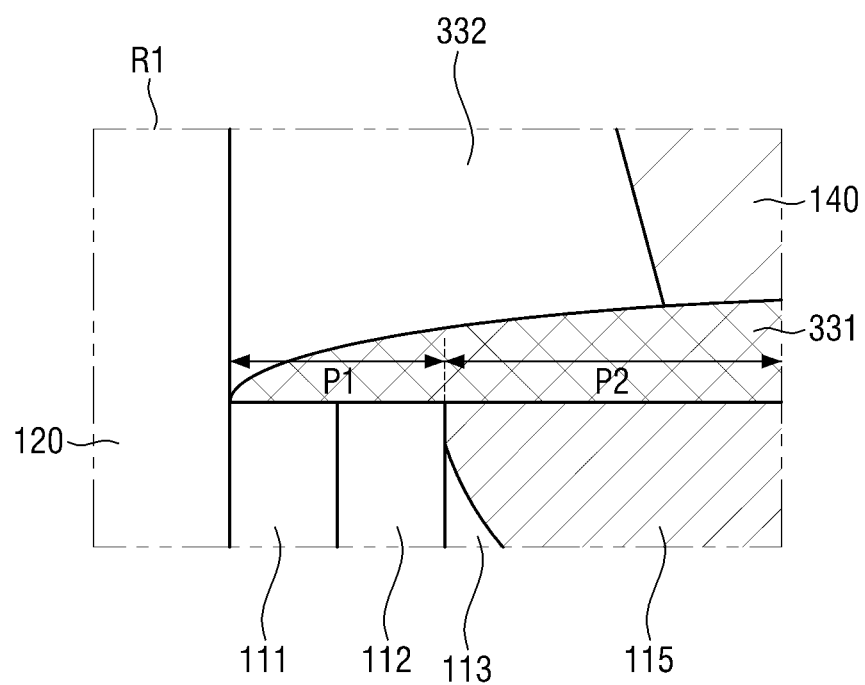
FIG. 8 is an enlarged cross-sectional view illustrating a part R1 of FIG. 7.

Referring to FIGS. 7 and 8, a first capping pattern 331 may include a first portion P1, which is on first spacers 111 and second spacers 112, and a second portion P2, which is on a gate electrode (113, 114, and 115). The thickness of the second portion P2 may be greater than the thickness of the first portion P1 (e.g., as measured in the vertical direction Z).

A second capping pattern 332 may fill part of a third recess T3 that is not filled with the first capping pattern 331 and a first gate contact CB1.

A semiconductor device according to some embodiments of the present disclosure will hereinafter be described with reference to FIGS. 9 and 10, focusing mainly on the differences with the semiconductor device of FIGS. 7 and 8.

Figure 9:
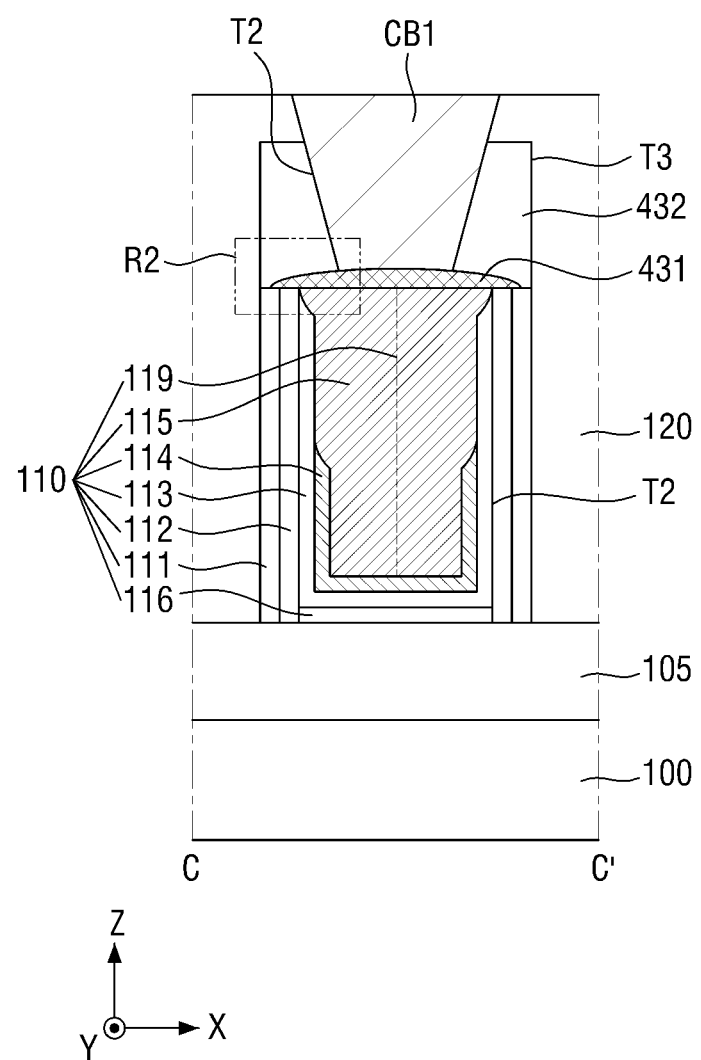
FIG. 9 is a cross-sectional view, taken along line C-C' of FIG. 1, of a semiconductor device according to some embodiments of the present disclosure.

FIG. 9 is a cross-sectional view, taken along line C-C' of FIG. 1, of a semiconductor device according to some embodiments of the present disclosure. FIG. 10 is an enlarged cross-sectional view illustrating a part R2 of FIG. 9.

Figure 10:
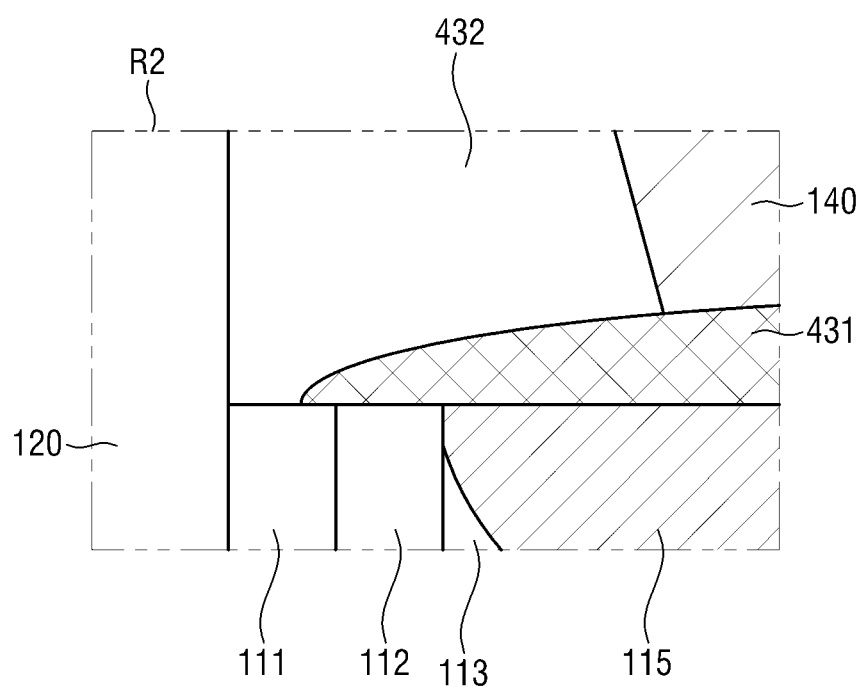
FIG. 10 is an enlarged cross-sectional view illustrating a part R2 of FIG. 9.

Referring to FIGS. 9 and 10, a first capping pattern 431 may not be in contact with an interlayer insulating film 120. A second capping pattern 432 may be in contact (e.g., direct contact) with (e.g., top surfaces of) first spacers 111.

In an implementation, the second capping pattern 432 may be in contact (e.g., direct contact) with the first spacers 111, and the first capping pattern 431 may be in contact (e.g., direct contact) with second spacers 112. In an implementation, the second capping pattern 432 may be in contact (e.g., direct contact) with both the first spacers 111 and the second spacers 112.

A semiconductor device according to some embodiments of the present disclosure will hereinafter be described with reference to FIGS. 11 and 12, focusing mainly on the differences with the semiconductor device of FIGS. 1 through 4A.

Figure 11:
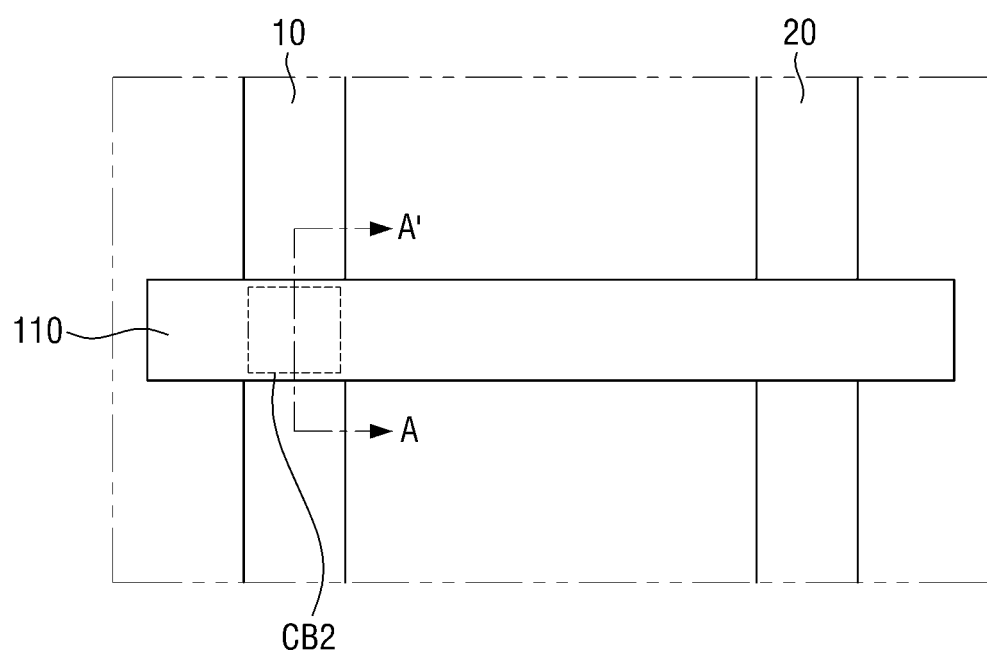
FIG. 11 is a plan view of a semiconductor device according to some embodiments of the present disclosure.

FIG. 11 is a plan view of a semiconductor device according to some embodiments of the present disclosure. FIG. 12 is a cross-sectional view taken along line A-A' of FIG. 11.

Figure 12:
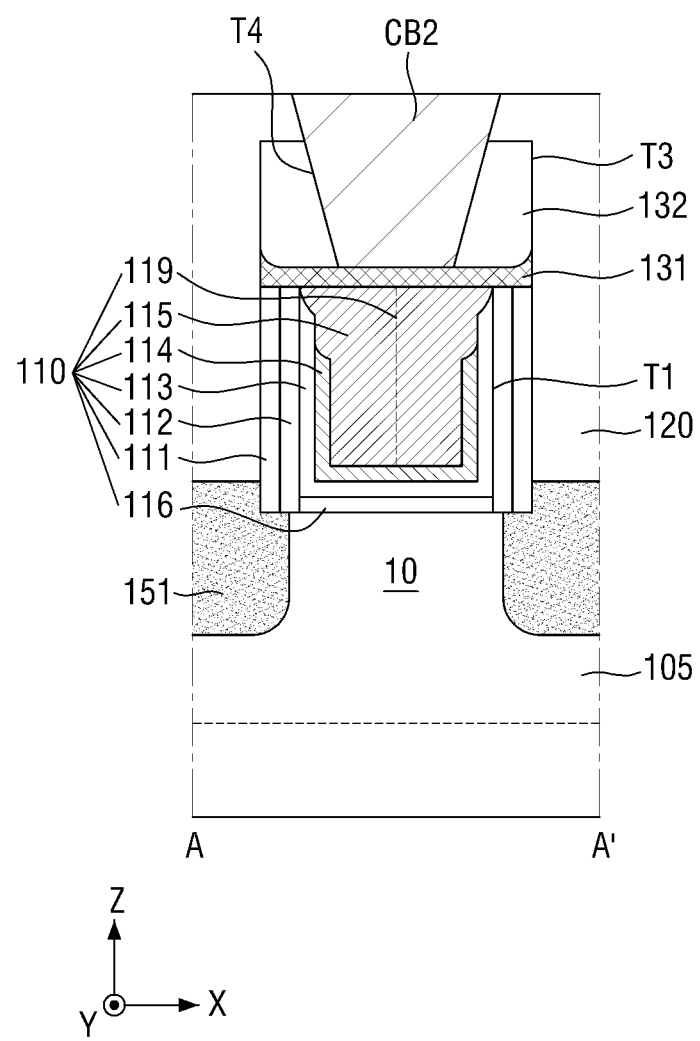
FIG. 12 is a cross-sectional view taken along line A-A' of FIG. 11.

Referring to FIGS. 11 and 12, a second gate contact CB2, unlike the first gate contact CB1 of FIG. 1, may be on a first fin-type pattern 10. The semiconductor device of FIGS. 11 and 12 may include a first gate contact CB1, which is between the first fin-type pattern 10 and a second fin-type pattern 20 or on the first fin-type pattern 10.

A semiconductor device according to some embodiments of the present disclosure will hereinafter be described with reference to FIG. 13, focusing mainly on the differences with the semiconductor device of FIGS. 1 through 4A.

Figure 13:
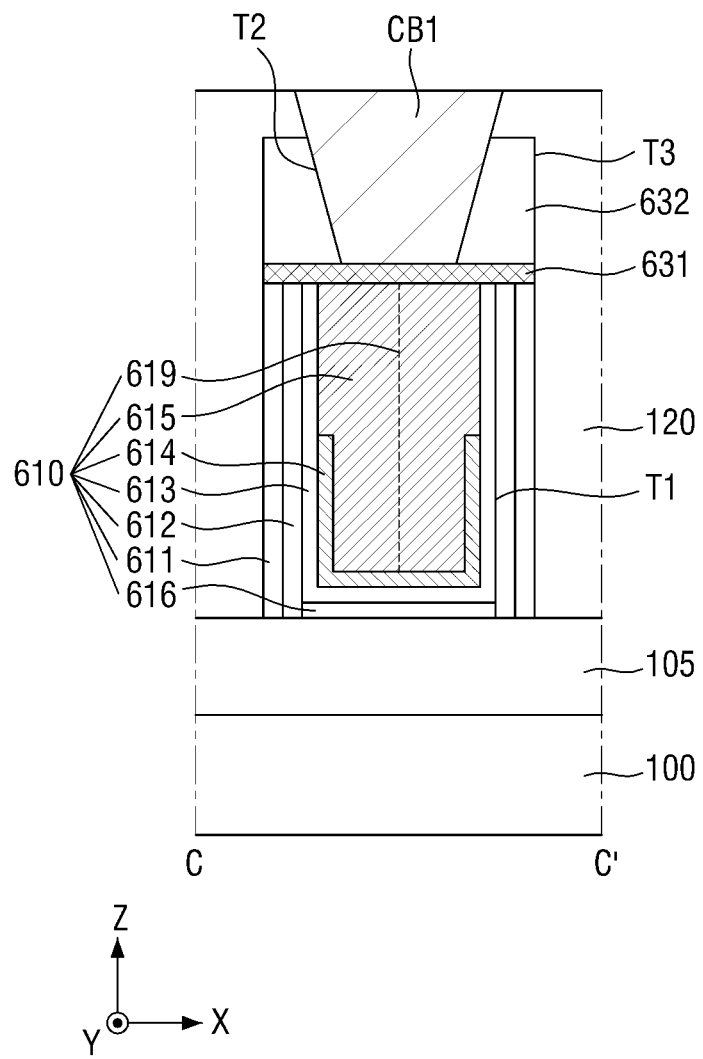
FIG. 13 is a cross-sectional view, taken along line C-C' of FIG. 1, of a semiconductor device according to some embodiments of the present disclosure.

FIG. 13 is a cross-sectional view, taken along line C-C' of FIG. 1, of a semiconductor device according to some embodiments of the present disclosure.

Referring to FIG. 13, a gate structure 610 may include a gate insulating film 613 formed conformally on the top surface of an interface film 616 and second spacers 612. The top surfaces of first spacers 611, the second spacers 612, the gate insulating film 613, and a filling film 615 may all fall on the same plane. A first capping pattern 631 and a second capping pattern 632 may be on the gate structure 610. The filling film 615 may include a seam structure 619.

A metal film 614 may be formed conformally along the profile of the entire gate insulating film 613 or along the profile of part of the gate insulating film 613.

A semiconductor device according to some embodiments of the present disclosure will hereinafter be described with reference to FIGS. 14 through 16, focusing mainly on the differences with the semiconductor device of FIGS. 1 through 4A.

Figure 14:
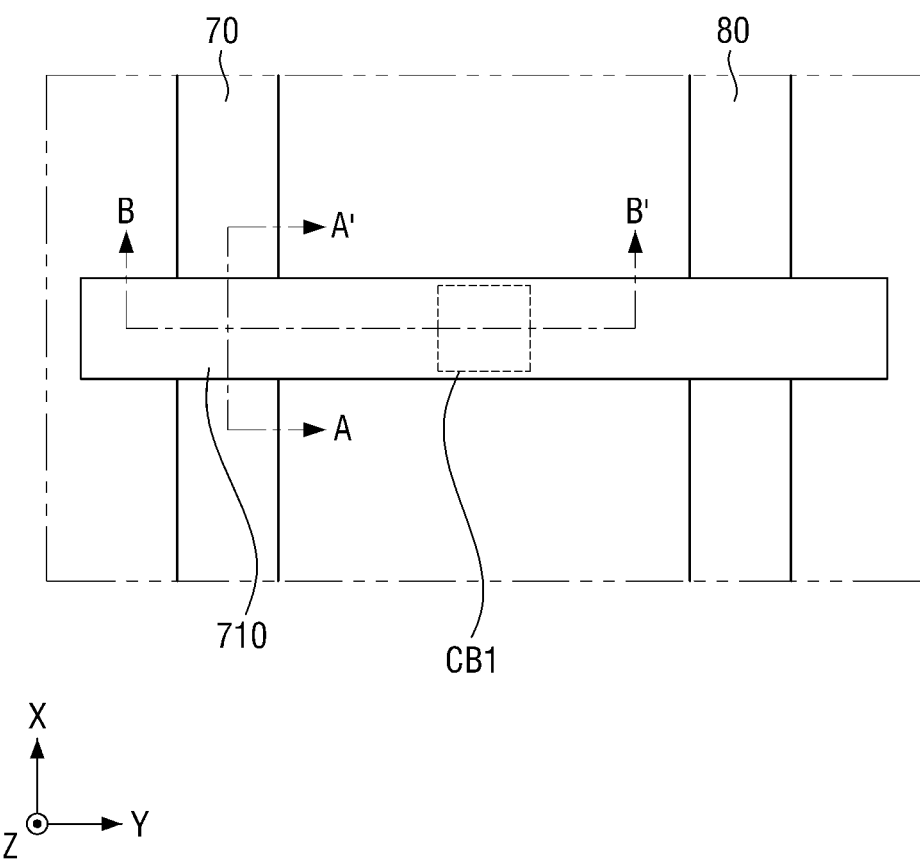
FIG. 14 is a plan view of a semiconductor device according to some embodiments of the present disclosure.

FIG. 14 is a plan view of a semiconductor device according to some embodiments of the present disclosure. FIG. 15 is a cross-sectional view taken along line A-A' of FIG. 14. FIG. 16 is a cross-sectional view taken along line B-B' of FIG. 14.

Figure 15:
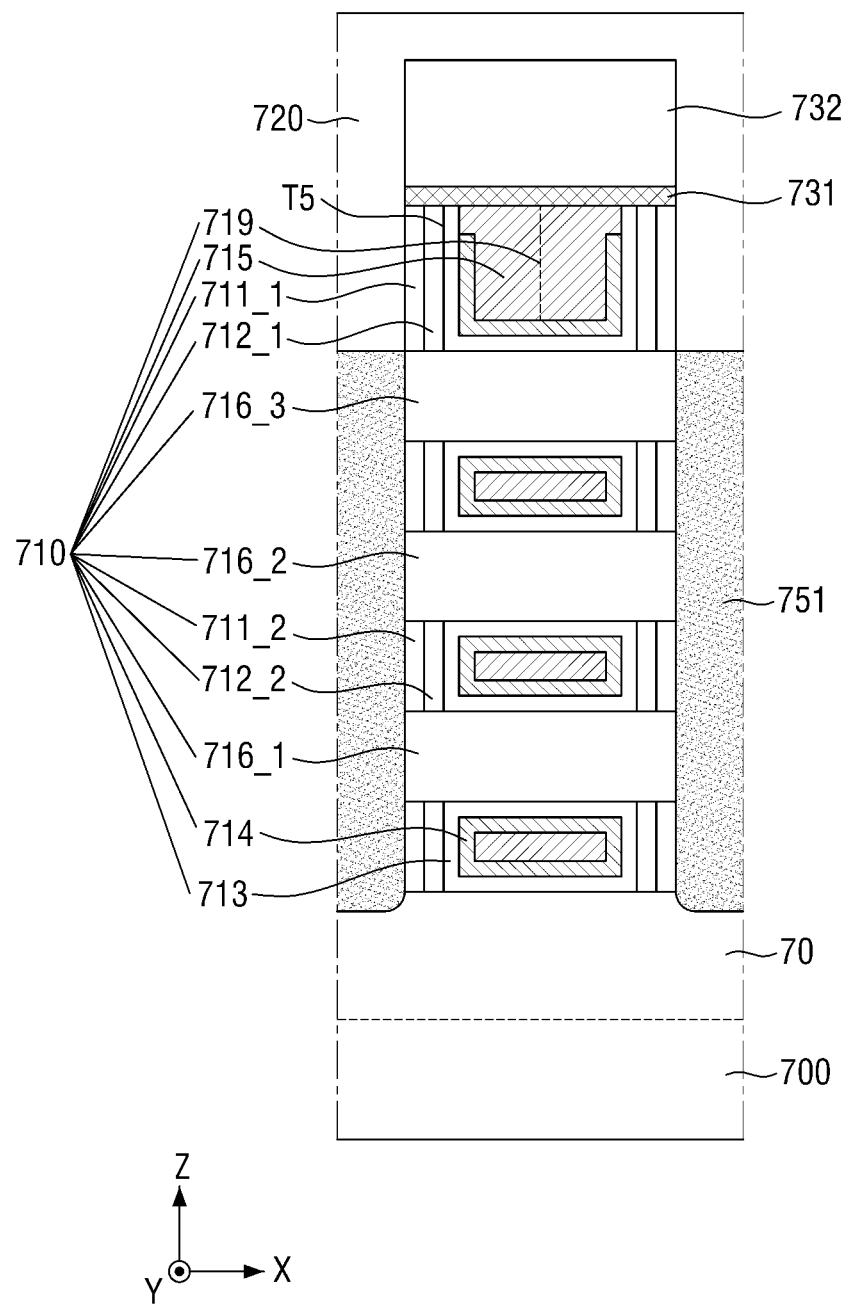
FIG. 15 is a cross-sectional view taken along line A-A' of FIG. 14.
Figure 16:
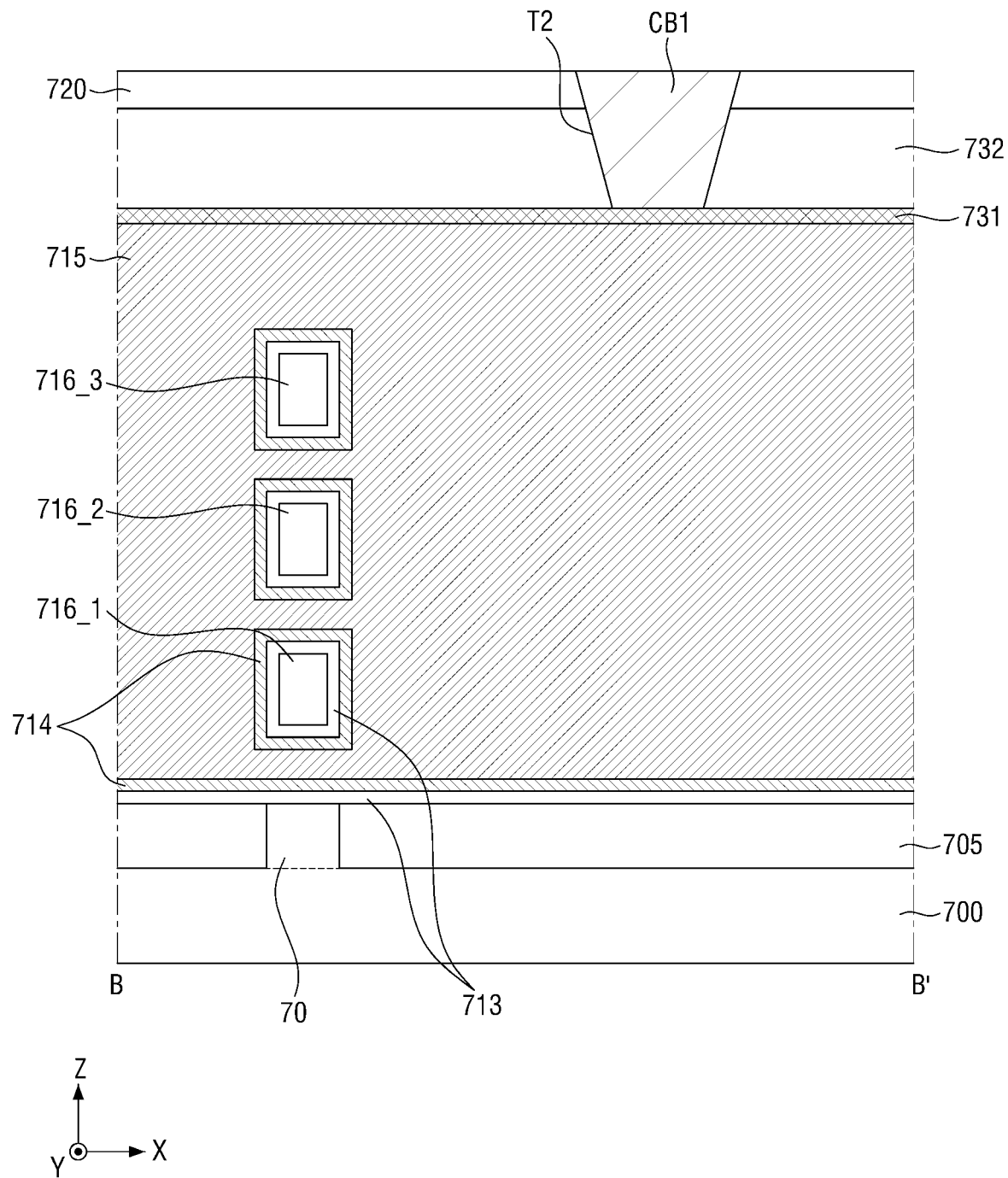
FIG. 16 is a cross-sectional view taken along line B-B' of FIG. 14.

Referring to FIGS. 14 through 16, the semiconductor device may include a substrate 700, a first fin-type pattern 70, a second fin-type pattern 80, a field insulating film 705, a gate structure 710, an interlayer insulating film 720, a first capping pattern 731, a second capping pattern 732, source/drain regions 751, a first gate contact CB1, and first, second, and third nanosheets 716_1, 716_2, and 716_3.

The substrate 700, the first fin-type pattern 70, the second fin-type pattern 80, the field insulating film 705, the gate structure 710, the interlayer insulating film 720, the first capping pattern 731, the second capping pattern 732, the source/drain region 751, and the first gate contact CB1 may correspond to the substrate 100, the first fin-type pattern 10, the second fin-type pattern 20, the field insulating film 105, the gate structure 110, the interlayer insulating film 120, the first capping pattern 131, the second capping pattern 132, the source/drain region 151, and the first gate contact CB1, respectively, of FIGS. 1 through 4A.

The gate structure 710 may include first outer spacers 711_1, second outer spacers 712_1, first inner spacers 711_2, second inner spacers 712_2, a gate insulating film 713, a metal film 714, a filling film 715, and a seam structure 719.

For convenience, an interface film is not illustrated in FIGS. 14 through 16. The interface film may be between the gate insulating film 713 and the substrate 700 or between the gate insulating film 713 and the first, second, and third nanosheets 716_1, 716_2, and 716_3.

The first outer spacers 711_1 and the second outer spacers 712_1 may correspond to the first spacers 111 and the second spacers 112, respectively, FIGS. 1 through 4A and may define a fifth recess T5, which corresponds to the third recess ST3 of FIGS. 1 through 4A.

The first inner spacers 711_2 and the second inner spacers 712_2 may be sequentially arranged on sides of the source/drain regions 751. The first inner spacers 711_2 and the second inner spacers 712_2 may include the same materials as the first outer spacers 711_1 and the second outer spacers 712_1, respectively.

The first inner spacers 711_2 and the second inner spacers 712_2 may be in contact (e.g., direct contact) with the first, second, and third nanosheets 716_1, 716_2, and 716_3.

In an implementation, three nanosheets, i.e., the first, second, and third nanosheets 716_1, 716_2, and 716_3, may be sequentially on the substrate 700, or the number of nanosheets disposed on the substrate 700 may vary.

The first, second, and third nanosheets 716_1, 716_2, and 716_3 may be sequentially on the substrate 700 to be spaced apart from one another in the vertical or third direction Z.

The first nanosheet 716_1 may be on the substrate 700 to be spaced apart from the substrate 700 in the third direction Z. The second nanosheet 716_2 may be disposed on the first nanosheet 716_1 to be spaced apart from the first nanosheet 716_1 in the thickness direction of the substrate 700, i.e., in the third direction Z. The third nanosheet 716_3 may be on the second nanosheet 716_2 to be spaced apart from the second nanosheet 716_2 in the third direction Z.

The first, second, and third nanosheets 716_1, 716_2, and 716_3 may extend (e.g., lengthwise) in a first direction X. In an implementation, the top surface of the third nanosheet 716_3, which is the uppermost nanosheet (e.g., distal to the substrate 100 in the third direction Z) on the first fin-type pattern 70, may be formed on substantially the same plane as the top surfaces of the source/drain regions 751.

The first, second, and third nanosheets 716_1, 716_2, and 716_3 may be surrounded by the gate structure 710. The first, second, and third nanosheets 716_1, 716_2, and 716_3 may be surrounded by a gate electrode (713, 714, and 715), which corresponds to the gate electrode (113, 114, and 115) of FIG. 1, and may be sequentially surrounded by the gate insulating film 713, the metal film 714, and the filling film 715.

The first, second, and third nanosheets 716_1, 716_2, and 716_3 may serve as channel regions, and the material of the first, second, and third nanosheets 716_1, 716_2, and 716_3 may vary depending on the type of the semiconductor device of FIGS. 14 and 15.

In a case where the semiconductor device of FIGS. 14 and 15 is an N-type metal oxide semiconductor (NMOS) transistor, the first, second, and third nanosheets 716_1, 716_2, and 716_3 may include, e.g., a material with high electron mobility. In a case where the semiconductor device of FIGS. 14 and 15 is a P-type metal oxide semiconductor (PMOS) transistor, the first, second, and third nanosheets 716_1, 716_2, and 716_3 may include, e.g., a material with high hole mobility.

A method of fabricating a semiconductor device according to some embodiments of the present disclosure will hereinafter be described with reference to FIGS. 17 through 26.

FIGS. 17 through 26 are cross-sectional views of stages in a method of fabricating a semiconductor device according to some embodiments of the present disclosure.

Figure 17:
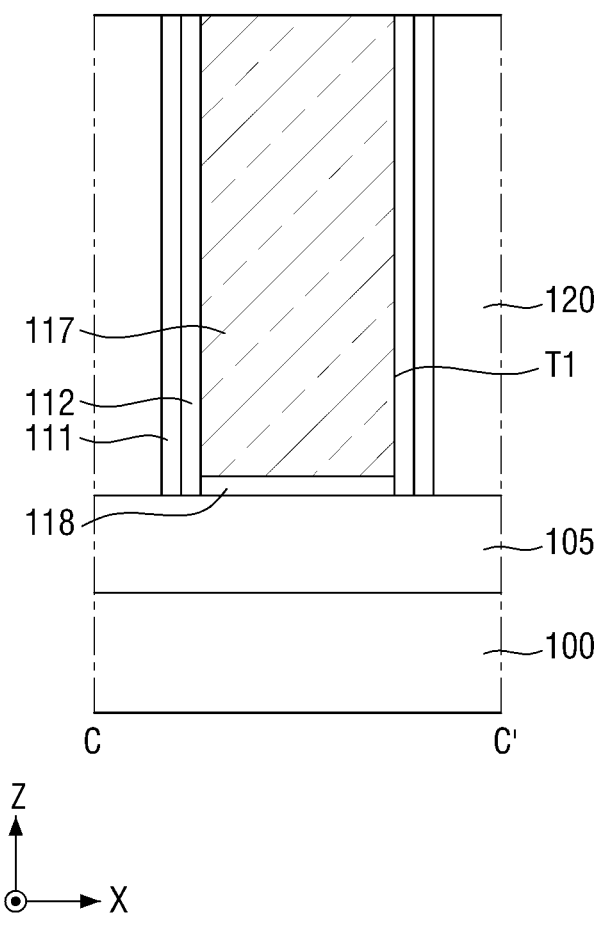
FIGS. 17 through 26 are cross-sectional views of stages in a method of fabricating a semiconductor device according to some embodiments of the present disclosure.

Referring to FIG. 17, a dummy gate insulating film 118 and a dummy gate electrode 117, which are sequentially stacked on a substrate 100, may be formed.

The dummy gate insulating film 118 may include, e.g., silicon oxide ($SiO_2$), silicon oxynitride (SiON), or a combination thereof. The dummy gate electrode 180 may include, e.g., silicon (Si), such as polysilicon, amorphous silicon (a-Si), or a combination thereof. The dummy gate electrode 117 may not be doped with impurities or may be doped with impurities.

Second spacers 112 and first spacers 111 may be sequentially formed on sides of the dummy gate electrode 117 and sides of the dummy gate insulating film 118. The first spacers 111 and the second spacers 112 may be provided in the form of pre-spacers.

In an implementation, the second spacers 112 may be formed on the sides of the dummy gate electrode 117 and the sides of the dummy gate insulating film 118.

An interlayer insulating film 120 may be formed on the substrate 100 to cover the dummy gate electrode 117. Thereafter, the top surface of the dummy gate electrode 117 and the first spacers 111 and the second spacers 112 may be exposed by planarizing the interlayer insulating film 120.

Figure 18:
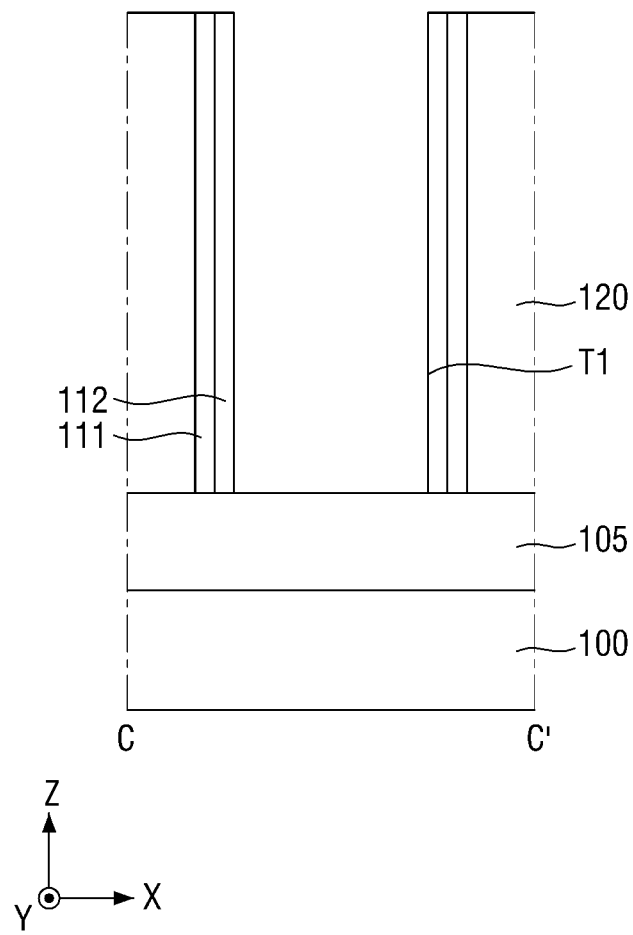

Referring to FIG. 18, the dummy gate insulating film 118 and the dummy gate electrode 117 may be removed. By removing the dummy gate insulating film 118 and the dummy gate electrode 117, a first recess T1 may be formed on a first fin-type pattern 10, or between the first fin-type pattern 10 and a second fin-type pattern 20.

The interlayer insulating film 120 may surround the first recess T1, which is defined by the first spacers 111 and the second spacers 112.

Figure 19:
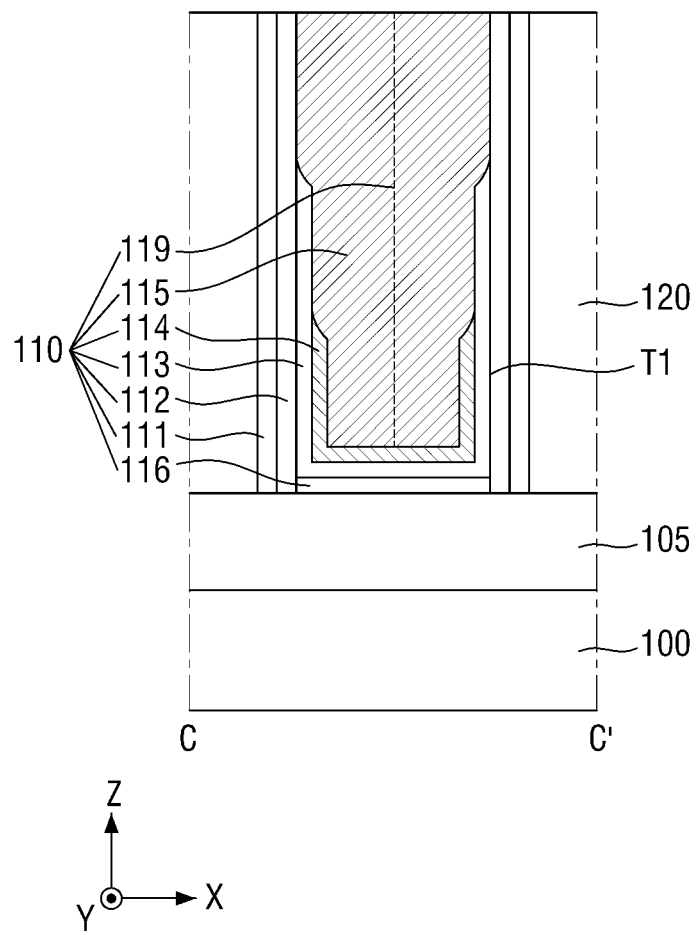

Referring to FIG. 19, a first interface film 116, a gate insulating film 113, a metal film 114, and a filling film 115 may be sequentially stacked on the substrate 100.

In an implementation, the first interface film 116 may be formed at the bottom of the first recess T1, and the gate insulating film 113 may be formed on the first interface film 116, the sidewalls of the first recess TS1, the top surfaces of the first spacers 141, and part of the top surface of the interlayer insulating film 120.

The metal film 114, which may include silicon (Si), may be formed along the profile of part of the gate insulating film 113, or the metal film 114 may be formed along the profile of the entire gate insulating film 113.

The metal film 114 may be formed by, e.g., atomic layer deposition (ALD), chemical vapor deposition (CVD), or sputtering.

The filling film 115 may be formed on the metal film 114 to fill the first recess T1.

Thereafter, part of the filling film 115 may be removed so that the top surfaces of the first spacers 111, the second spacers 112, and the filling film 115 may fall on the same plane through planarization or etching. In this case, the gate insulating film 113 and the filling film 115 may be provided in the form of a pre-gate electrode.

Figure 20:
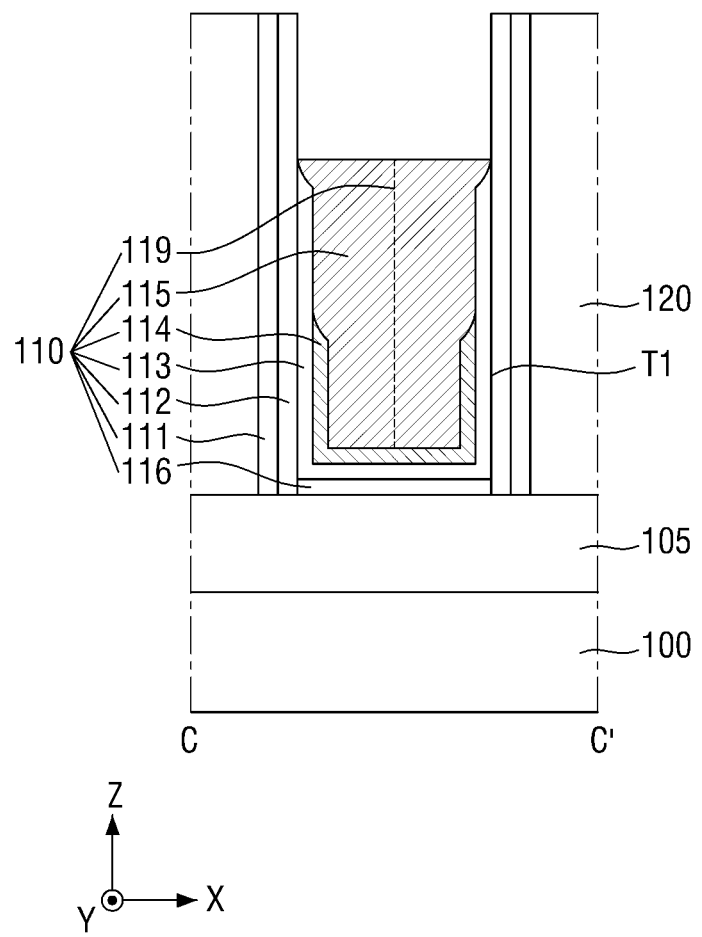

Referring to FIG. 20, part of the filling film 115 may be removed. As a result, the top surface of the filling film 115 may become lower (e.g., closer to the substrate 100 in the vertical direction Z) than the top surfaces of the first spacers 111, the second spacers 112, and the interlayer insulating film 120. In an implementation, the removal of part of the filling film 115 may include performing wet etching and dry etching and may use a mask pattern.

Figure 21:
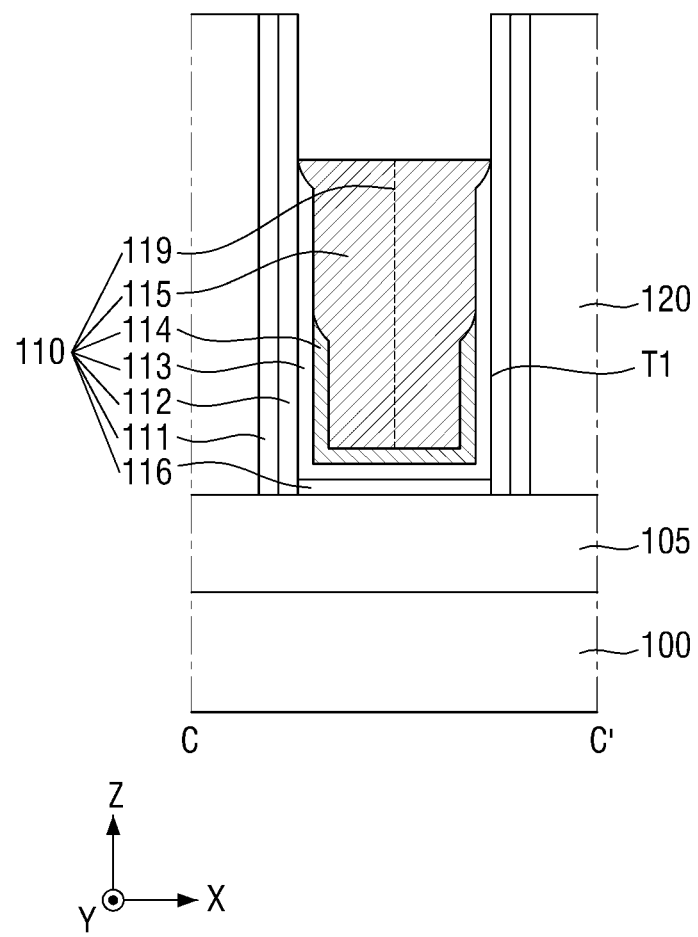

Referring to FIG. 21, parts of the first spacers 111 and parts of the second spacers 112 may be removed. The top surfaces of the gate insulating film 113, the first spacers 111, and the second spacers 112 may be lower than the top surface of the interlayer insulating film 120. In an implementation, the top surfaces of the first spacers 111, the second spacers 112, and the filling film 115 may fall on the same plane.

The removal of parts of the first spacers 111 and parts of the second spacers 112 may include performing both wet etching and dry etching and may use a mask pattern.

Figure 22:
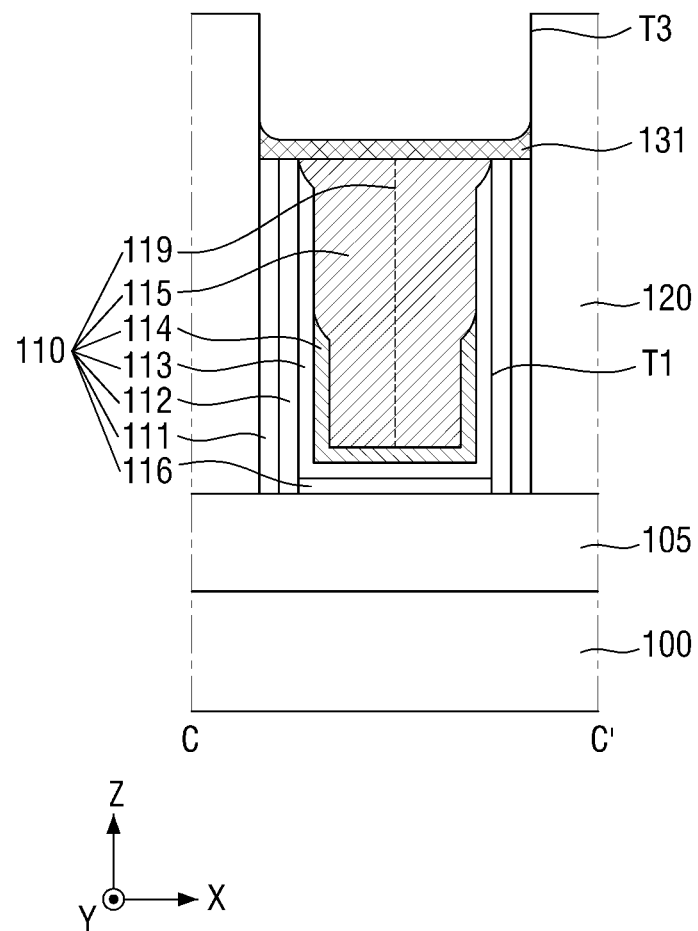

Referring to FIG. 22, a first capping pattern 131 may be formed on a gate structure 110. The first capping pattern 131 may be formed conformally, and may form inclined structures, at both ends thereof, that become thicker closer to the second spacers 112. The formation of the first capping pattern 131 will be described below in detail with reference to FIGS. 27 through 30.

Figure 23:
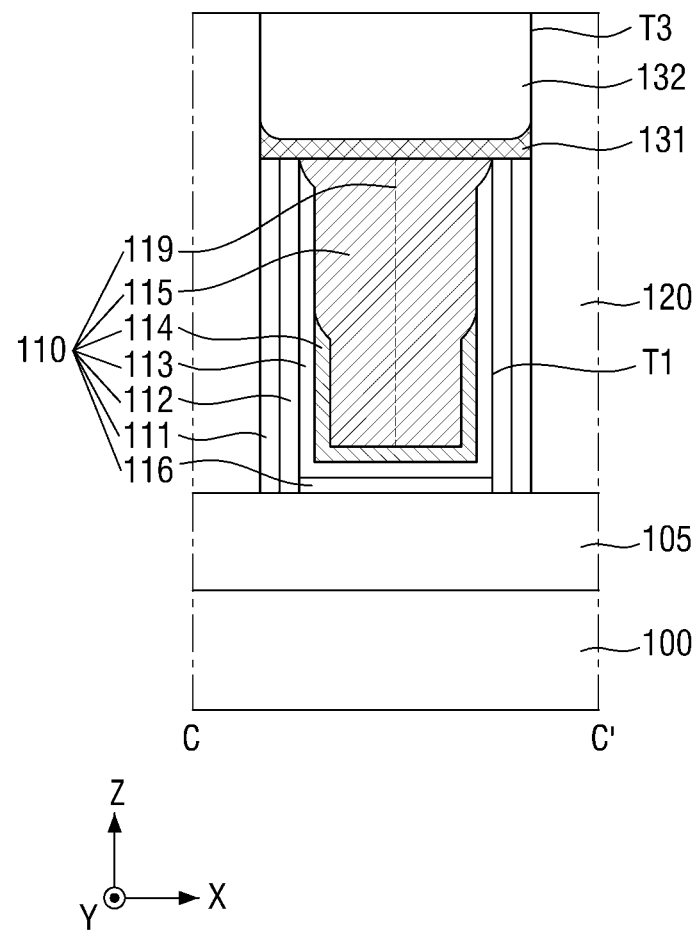

Referring to FIG. 23, a second capping pattern 132 may be formed on the first capping pattern 131. The second capping pattern 132 may fill a third recess T3. After the formation of the second capping pattern 132, the second capping pattern 132 may be planarized together with the interlayer insulating film 120 so that the top surfaces of the second capping pattern 132 and the interlayer insulating film 120 may fall on the same plane. The second capping pattern 132 may be formed by, e.g., atomic layer deposition (ALD), chemical vapor deposition (CVD), or sputtering.

Figure 24:
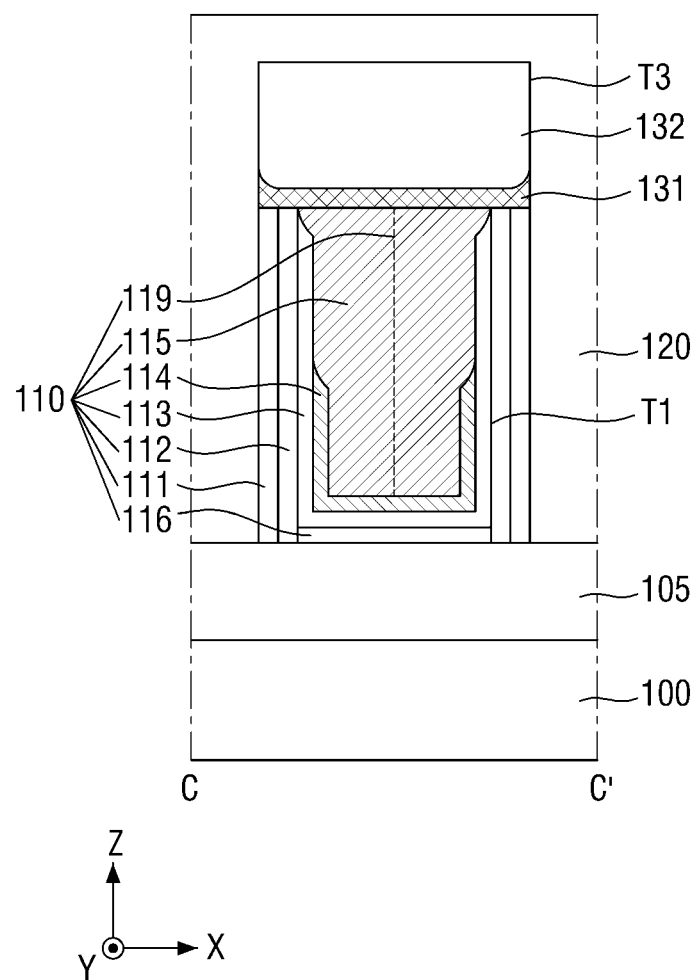

Referring to FIG. 24, an insulating film 120 may be additionally formed on the top surfaces of the second capping pattern 132 and the interlayer insulating film 120 of FIG. 23 by, e.g., atomic layer deposition (ALD), chemical vapor deposition (CVD), or sputtering.

Figure 25:
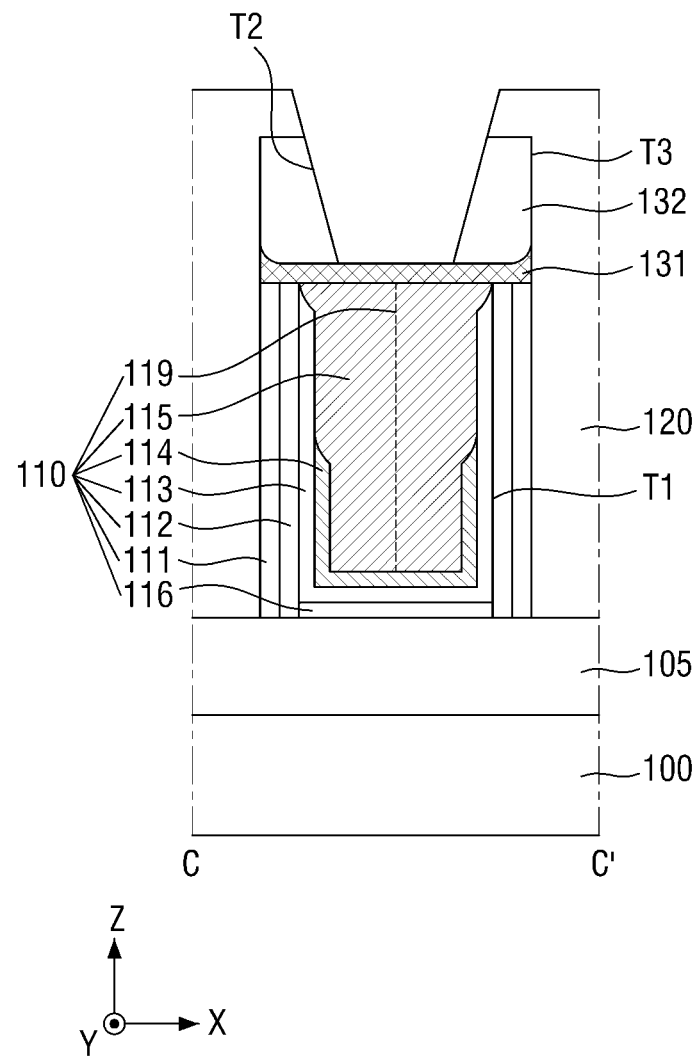

Referring to FIG. 25, a second recess T2 may be formed to penetrate the second capping pattern 132 and the interlayer insulating film 120. The sides of the second recess T2 may adjoin the second capping pattern 132 and the interlayer insulating film 120, and the bottom of the second recess T2 may adjoin the first capping pattern 131. The formation of the second recess T2 may include performing etching, e.g., both wet etching and dry etching.

After etching for forming the second recess T2, passivation and cleaning processes may be performed. The mixture of an isopropyl alcohol (IPA) solution and a LAL solution may be used in the passivation and cleaning processes.

Figure 26:
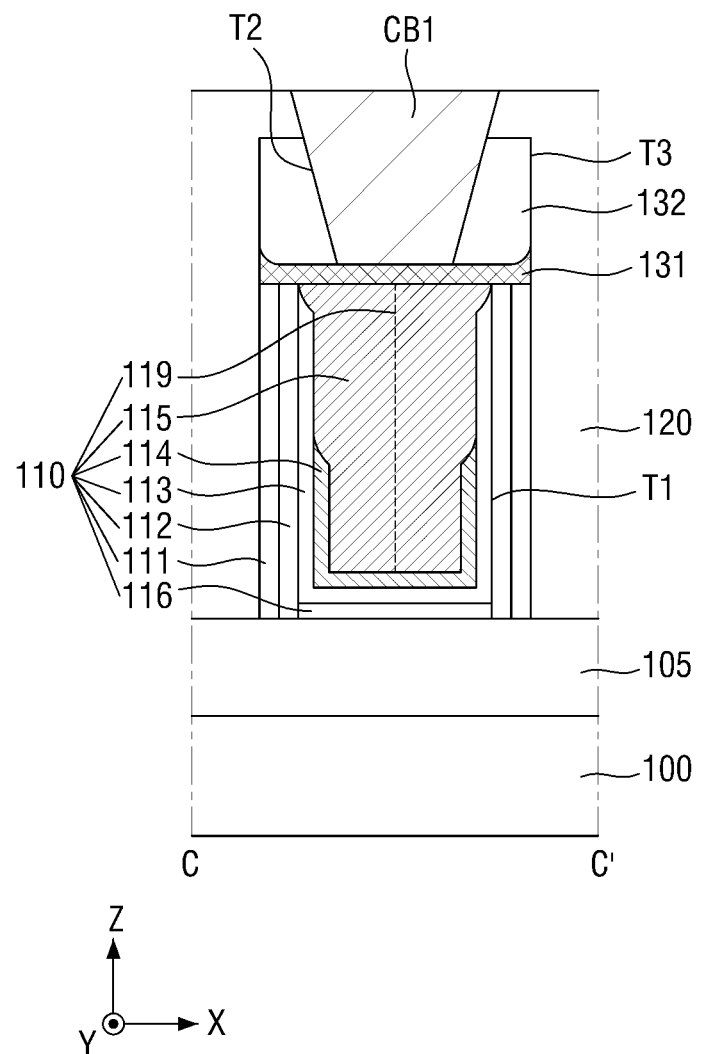

Referring to FIG. 26, a first gate contact CB1 may be formed by filling the second recess T2.

Figure 27:
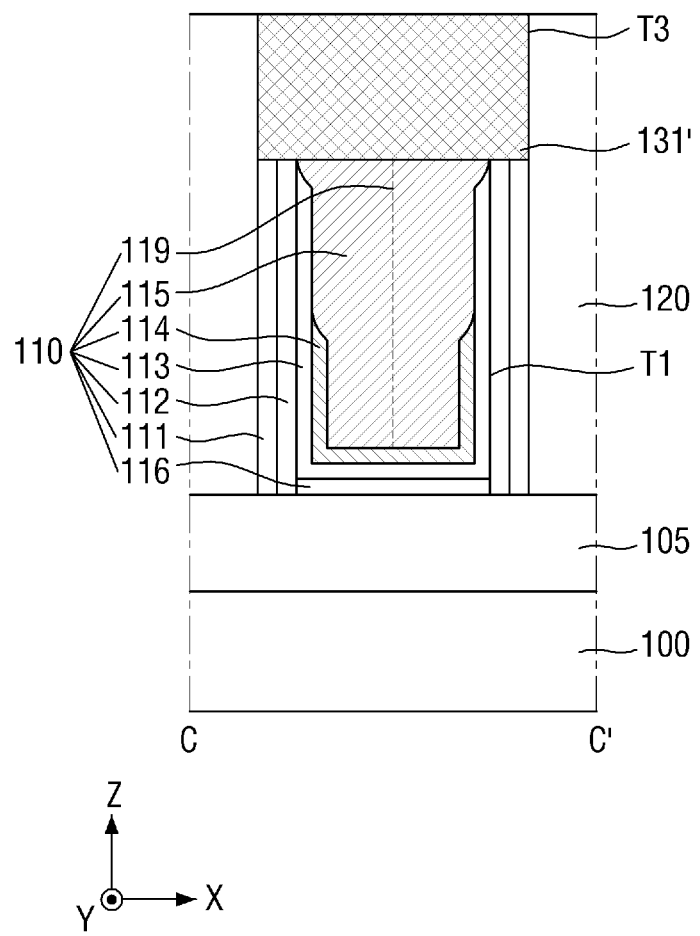
FIGS. 27 and 28 are cross-sectional views illustrating an embodiment of the stage in the method illustrated in FIG. 22.
Figure 28:
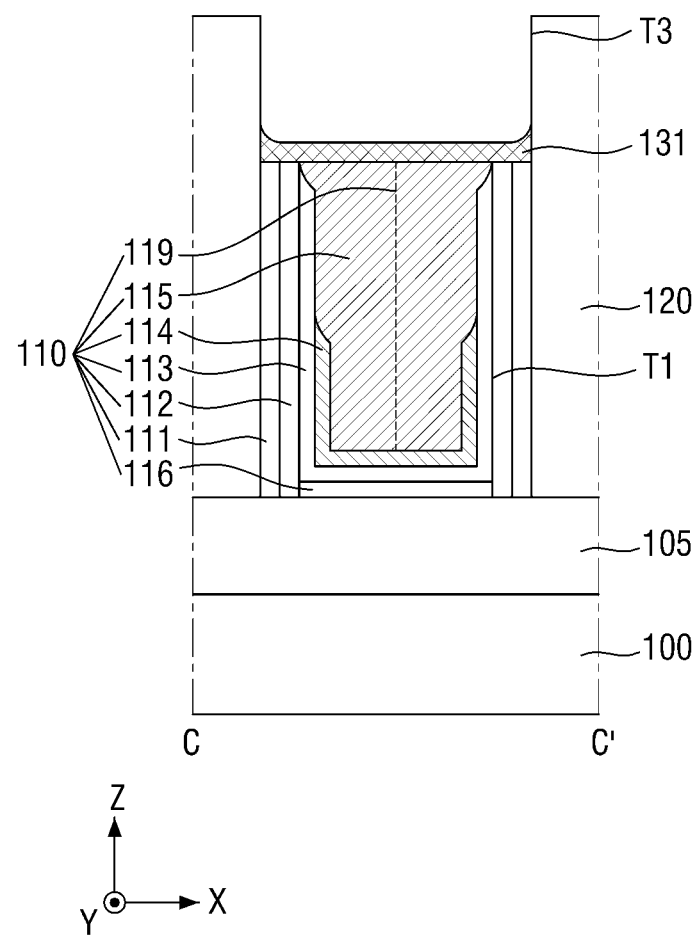

FIGS. 27 and 28 are cross-sectional views illustrating an embodiment of the stage in the method illustrated in FIG. 22.

Referring to FIG. 27, after the steps illustrated in FIGS. 17 through 21, the third recess T3 may be filled with a preliminary first capping pattern 131'. The preliminary first capping pattern 131' may be formed by, e.g., atomic layer deposition (ALD), chemical vapor deposition (CVD), or sputtering.

Referring to FIG. 28, part of the preliminary first capping pattern 131', which fills the third recess T3, may be removed. As a result, the first capping pattern 131 may be formed conformally on the gate structure 110, and may form inclined structures, at both ends thereof, that become thicker closer to the interlayer insulating film 120, and the top surface of the first capping pattern 131 may become lower than the top surface of the interlayer insulating film 120.

The removal of part of preliminary first capping pattern 131' may include performing both wet etching and dry etching and may use a mask pattern. Thereafter, the steps illustrated in FIGS. 23 through 26 may be performed.

Figure 29:
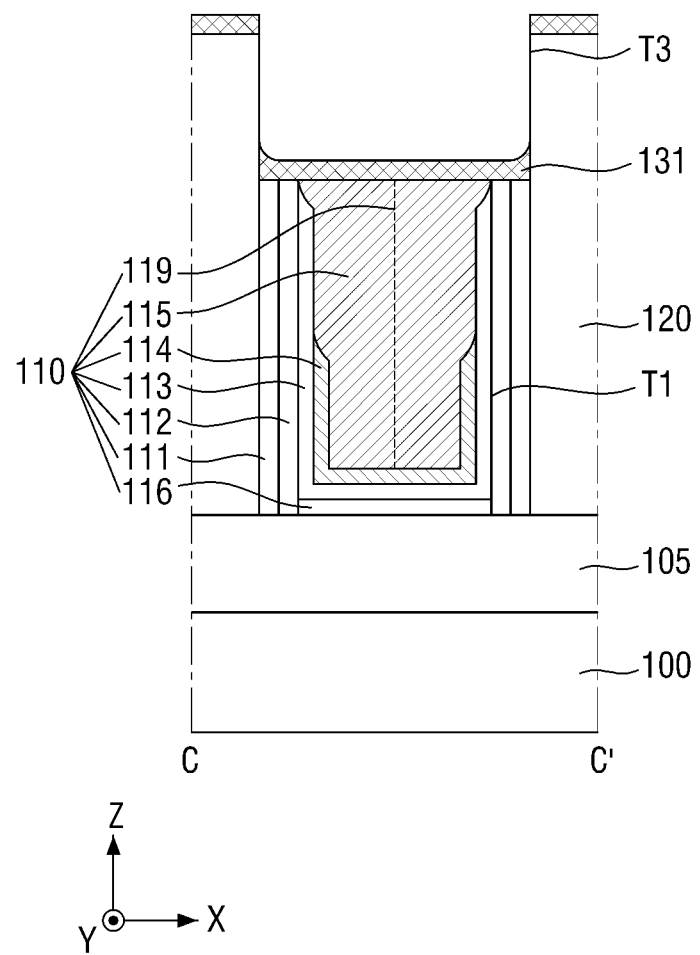
FIGS. 29 and 30 are cross-sectional views illustrating another embodiment of the stage in the method illustrated in FIG. 22.
Figure 30:
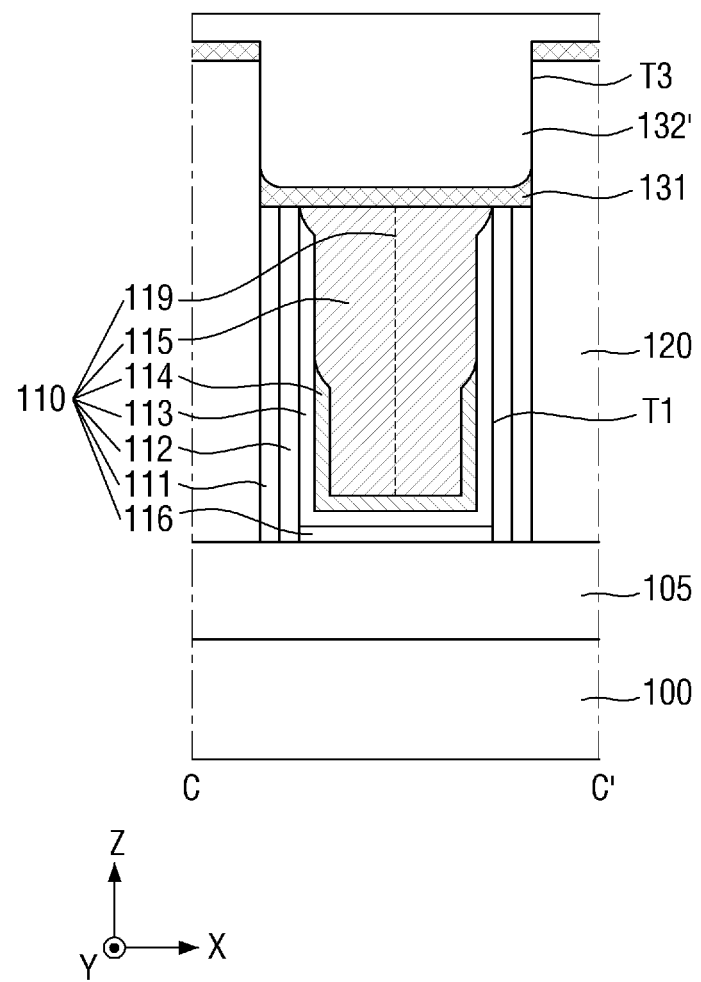

FIGS. 29 and 30 are cross-sectional views illustrating another embodiment of the stage in the method illustrated in FIG. 22.

Referring to FIG. 29, after the steps illustrated in FIGS. 17 through 21, a first capping pattern 131 may be formed on a gate structure 110 and on the top surface of an interlayer insulating film 120. The first capping pattern 131 may be formed in a direction toward a substrate 100.

The first capping pattern 131 may be formed by, e.g., physical vapor deposition (PVD), and a straight pattern may be formed. As a result, the first capping pattern 131 may be formed conformally on the gate structure 110, and may form inclined structures, at both ends thereof, that become thicker closer to the interlayer insulating film 120.

Referring to FIG. 30, a preliminary second capping pattern 132' may be formed to cover the entire first capping pattern 131. The preliminary second capping pattern 132' may cover the uppermost part of the first capping pattern 131.

The preliminary second capping pattern 132' may be formed by, e.g., atomic layer deposition (ALD), chemical vapor deposition (CVD), or sputtering.

After the formation of the preliminary second capping pattern 132', a planarization process may be performed such that part of the first capping pattern 131 on the interlayer insulating film 120 may be removed. Thereafter, the steps illustrated in FIGS. 23 through 26 may be performed.

Figure 31:
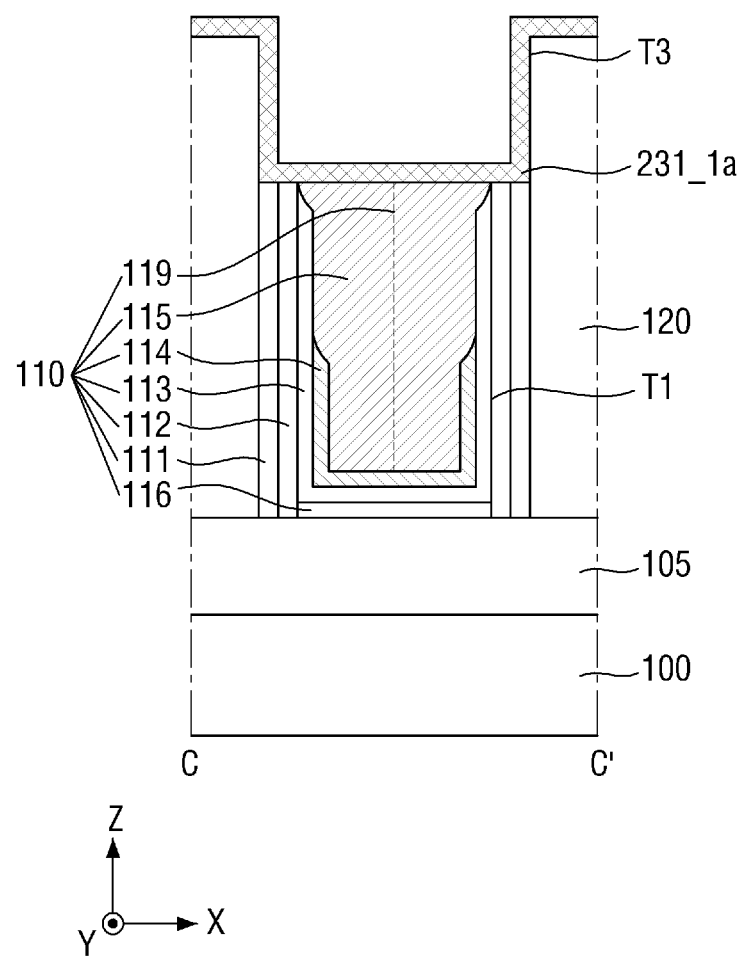
FIGS. 31 through 33 are cross-sectional views illustrating yet another embodiment of the stage in the method illustrated in FIG. 22.
Figure 32:
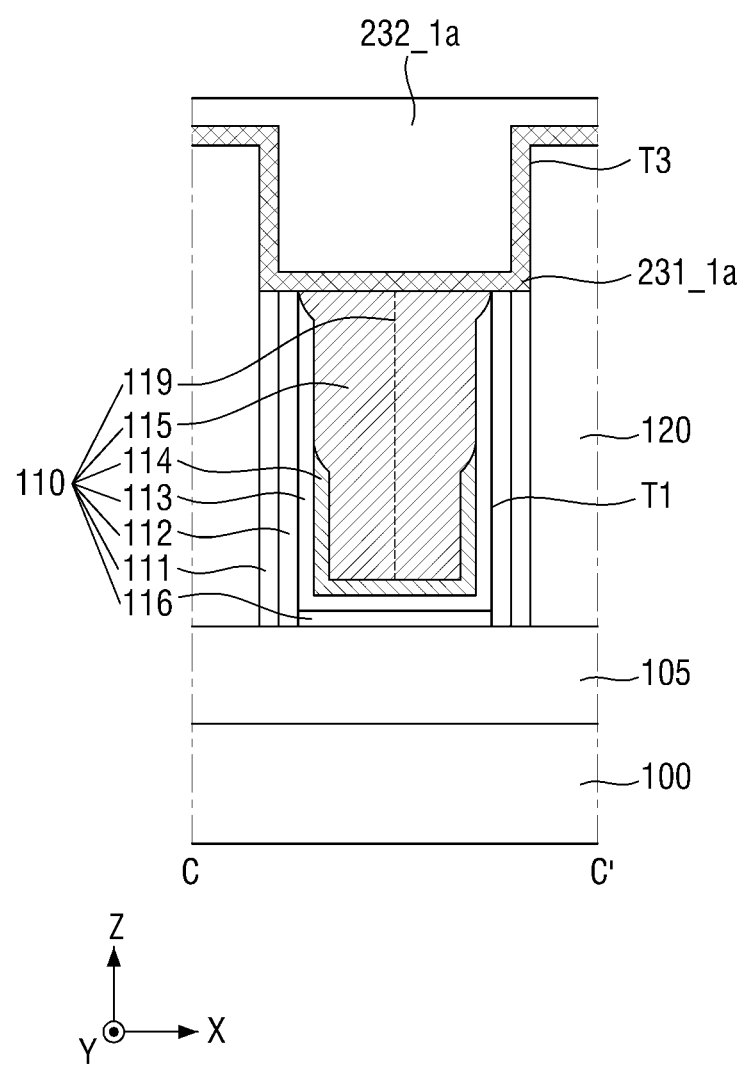
Figure 33:
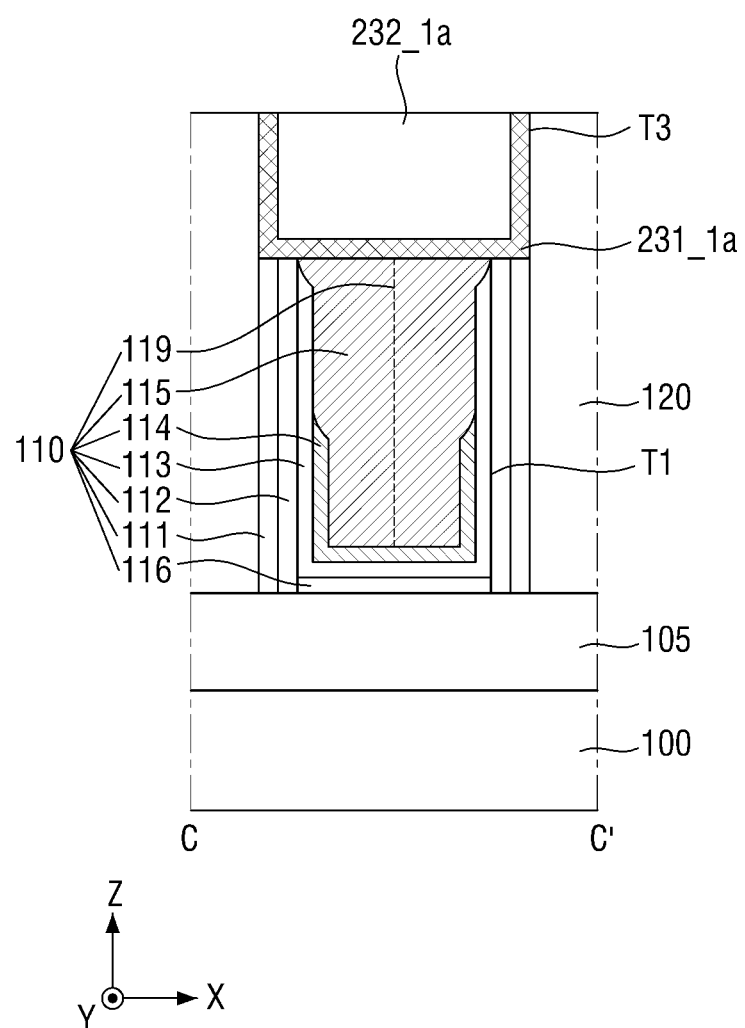

FIGS. 31 through 33 are cross-sectional views illustrating yet another embodiment of the stage in the method illustrated in FIG. 22.

Referring to FIG. 31, after the steps illustrated in FIGS. 17 through 21, a first capping pattern 231_1a may be formed on a gate structure 110 and along the top surface and the sides of an interlayer insulating film 120. The first capping pattern 231_1a may be formed conformally.

The first capping pattern 231_1a may be formed by, e.g., atomic layer deposition (ALD), chemical vapor deposition (CVD), or sputtering, but the present disclosure is not limited thereto.

Referring to FIG. 32, a second capping pattern 232_1a may be formed to cover the entire first capping pattern 231_1a. The second capping pattern 232_1a may cover the uppermost part of the first capping pattern 231_1a.

The second capping pattern 232_1a may be formed by, e.g., atomic layer deposition (ALD), chemical vapor deposition (CVD), or sputtering.

Referring to FIG. 33, after the formation of the second capping pattern 232_1a, a planarization process may be performed such that part of the first capping pattern 231_1a on the interlayer insulating film 120 may be removed. Thereafter, the steps illustrated in FIGS. 23 through 26 may be performed.

FIGS. 34 through 39 are cross-sectional views illustrating a method of fabricating a semiconductor device according to some embodiments of the present disclosure.

Figure 34:
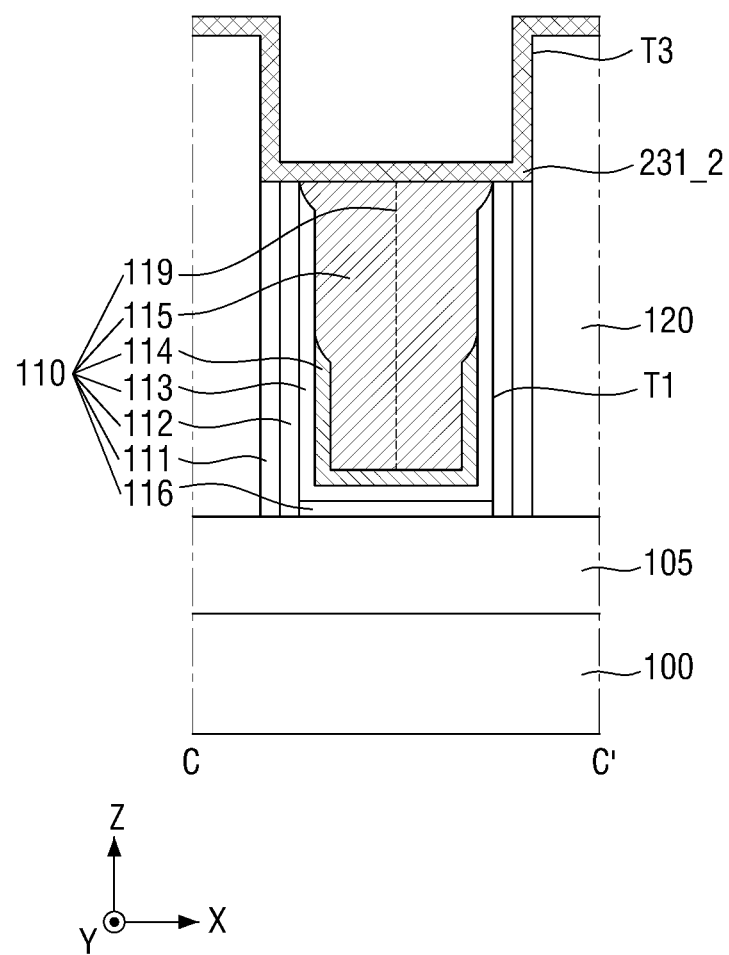
FIGS. 34 through 39 are cross-sectional views of stages in a method of fabricating a semiconductor device according to some embodiments of the present disclosure.

Referring to FIG. 34, after the steps illustrated in FIGS. 17 through 21, a first capping pattern 231_2 may be formed on a gate structure 110 and along the top surface and the sides of an interlayer insulating film 120. The first capping pattern 231_2 may be formed conformally.

The first capping pattern 231_2 may be formed by, e.g., atomic layer deposition (ALD), chemical vapor deposition (CVD), or sputtering, but the present disclosure is not limited thereto.

Figure 35:
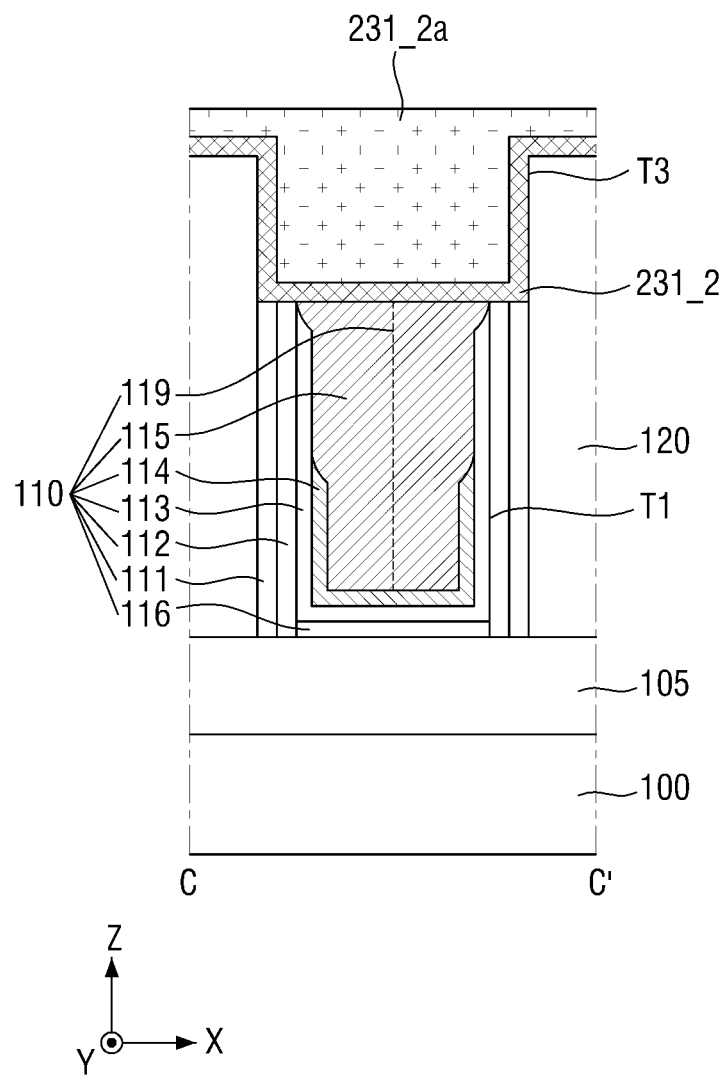

Referring to FIG. 35, a mask pattern 231_2a may be formed to cover an entire first capping pattern 231_2. The mask pattern 231_2a may cover the uppermost part of the first capping pattern 231_2. The mask pattern 231_2a may include, e.g., a spin-on-hard mask (SOH).

The mask pattern 231_2a may be formed by, e.g., atomic layer deposition (ALD), chemical vapor deposition (CVD), or sputtering.

Figure 36:
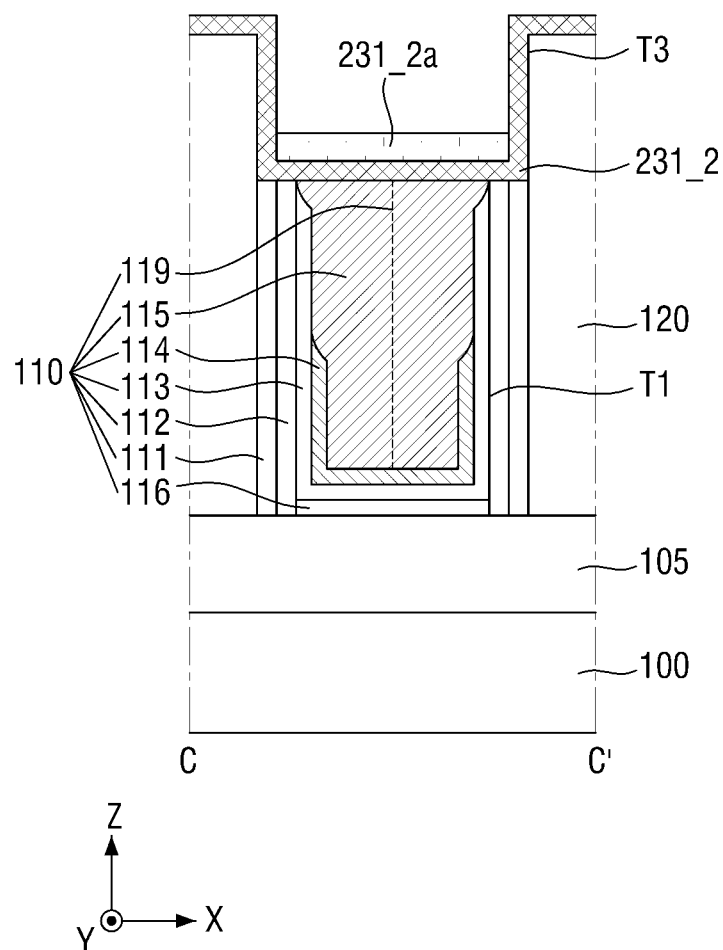

Referring to FIG. 36, part of the mask pattern 231_2*a* may be removed. As a result, the mask pattern 231_2*a* may be surrounded by a third recess T3.

The removal of part of the mask pattern 231_2*a* may include, e.g., performing both wet etching and dry etching and may use a mask pattern. Thereafter, the steps illustrated in FIGS. 23 through 26 may be performed.

Figure 37:
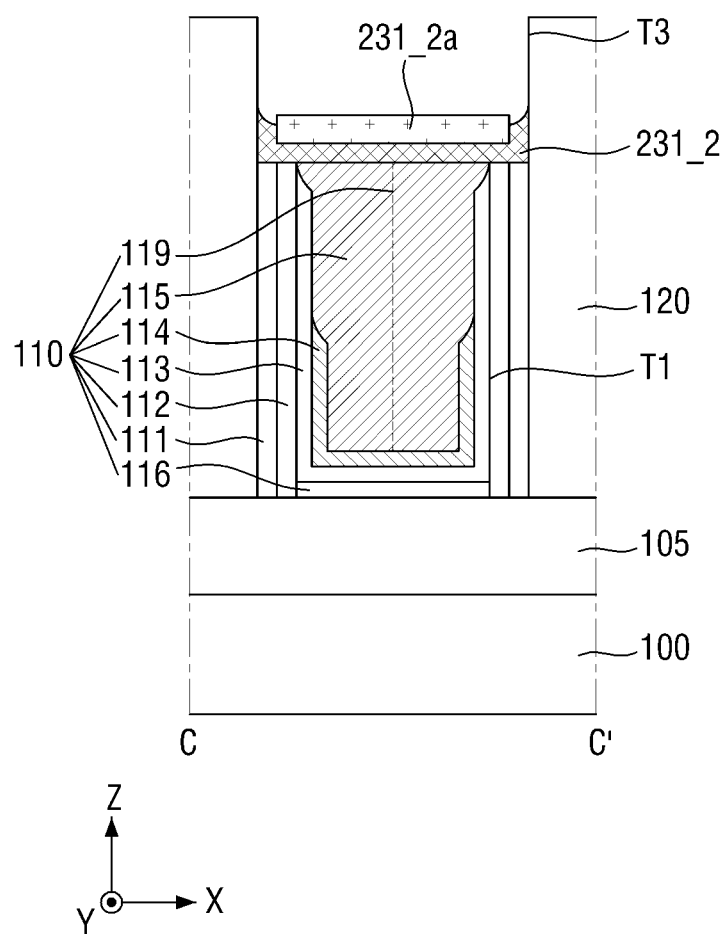

Referring to FIG. 37, parts of the first capping pattern 231_2 in regions other than that protected by the mask pattern 231_2*a* may be removed. Part of the first capping pattern 231_2 below the bottom surface of the mask pattern 231_2*a* may be protected, and parts of the first capping pattern 231_2 on the sidewalls of the mask pattern 231_2*a* may be removed and other parts may remain unremoved due to thickness of capping pattern 231_2.

The removal of parts of the first capping pattern 231_2 may include, e.g., performing both wet etching and dry etching and may use a mask pattern. Thereafter, the steps illustrated in FIGS. 23 through 26 may be performed.

Figure 38:
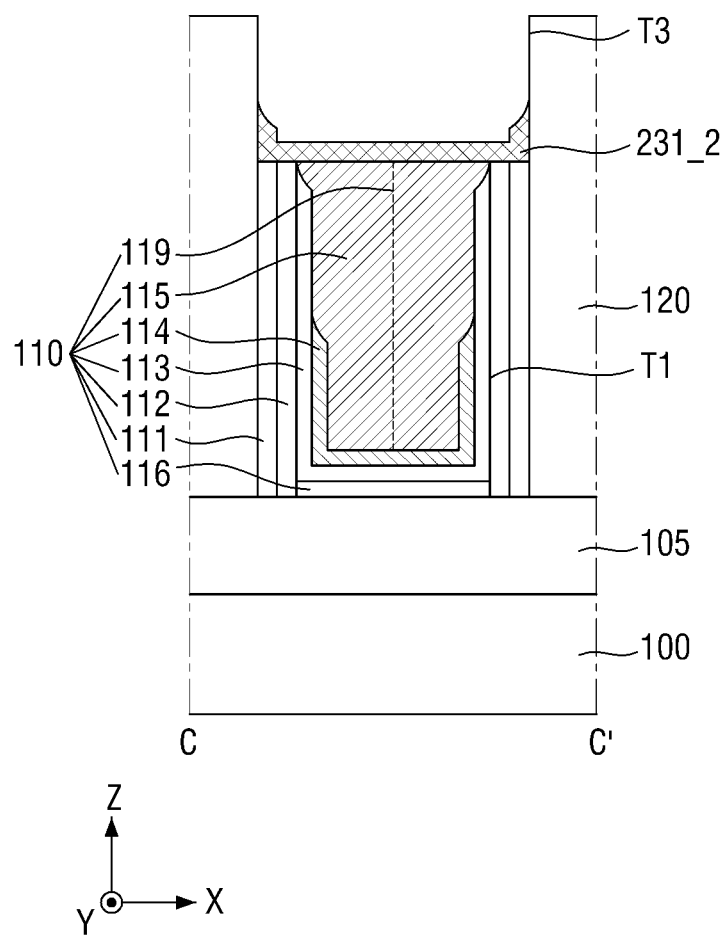

Referring to FIG. 38, the mask pattern 231_2*a* may be removed, and cleaning may be performed. After the removal of the mask pattern 231_2*a* and cleaning, parts of the first capping pattern 231_2 that are in contact with the interlayer insulating film 120 may be thicker than parts of the first capping pattern 231_2 that are not in contact with the interlayer insulating film 120.

Figure 39:
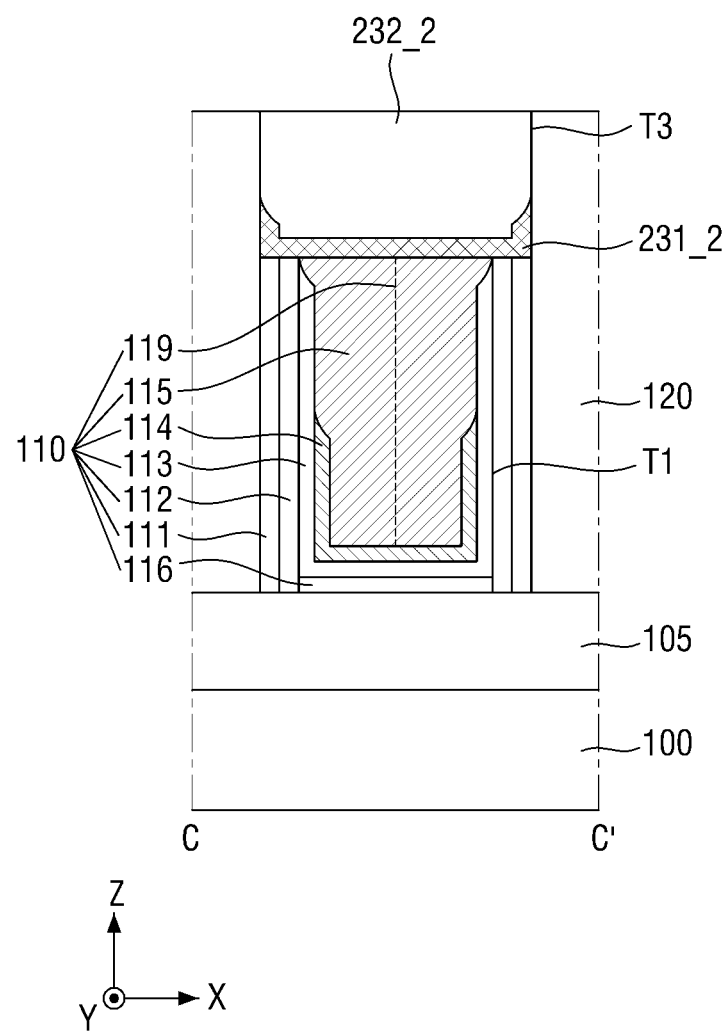

Referring to FIG. 39, a second capping pattern 232_2 may be formed on the first capping pattern 231_2. The second capping pattern 232_2 may fill the third recess T3. Thereafter, the steps illustrated in FIGS. 24 through 26 may be performed.

Figure 40:
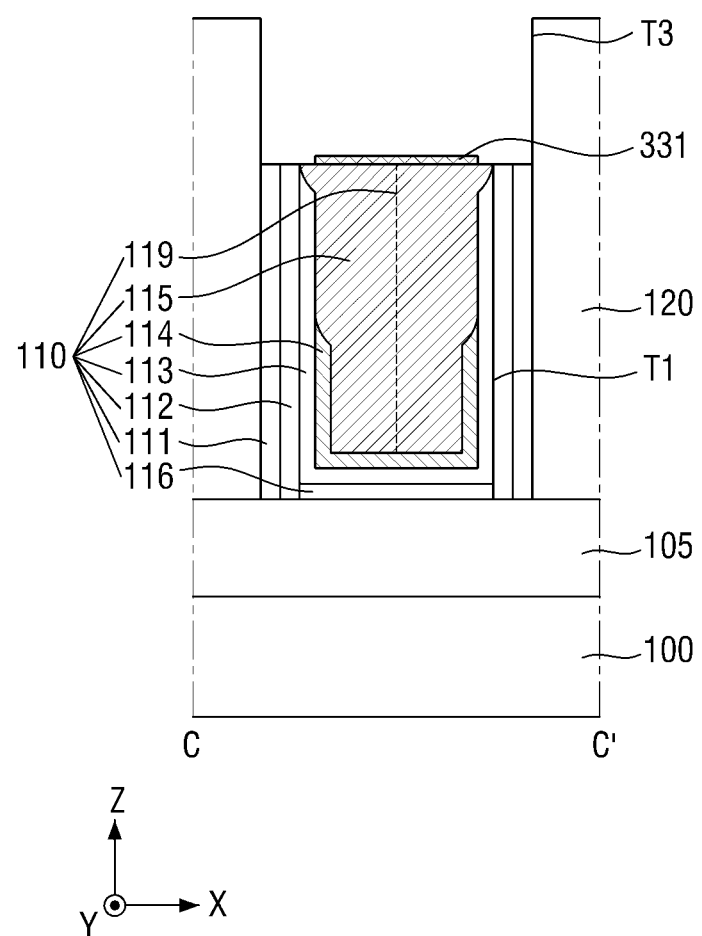
FIGS. 40 through 42 are cross-sectional views of stages in a method of fabricating a semiconductor device according to some embodiments of the present disclosure.
Figure 41:
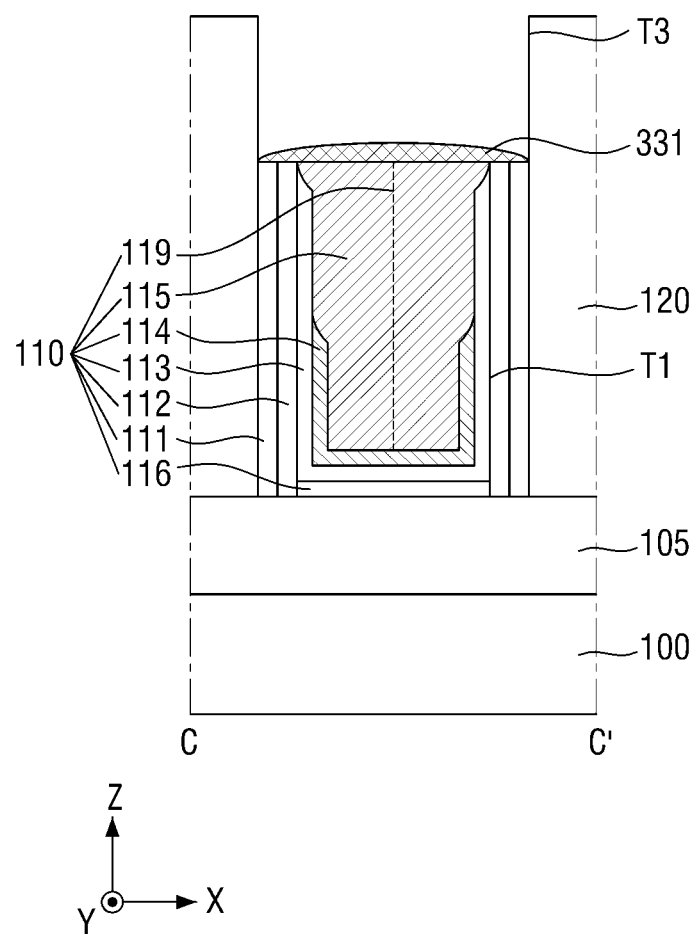
Figure 42:
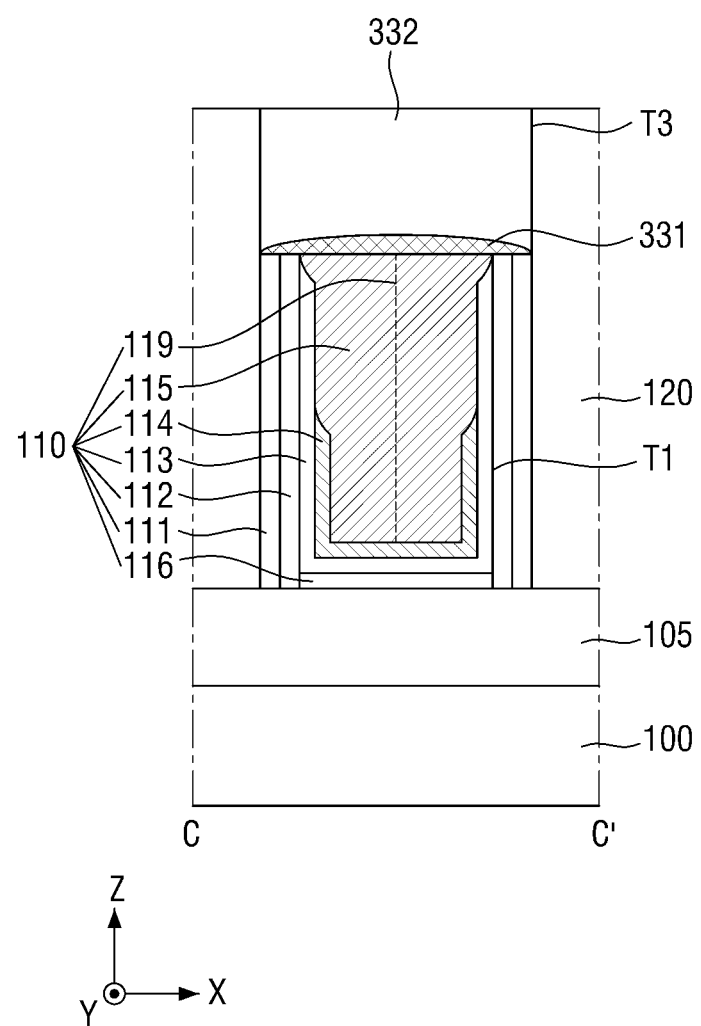

FIGS. 40 through 42 are cross-sectional views of stages in a method of fabricating a semiconductor device according to some embodiments of the present disclosure.

Referring to FIG. 40, after the steps illustrated in FIGS. 16 through 21, passivation and curing may be performed. The performing of passivation and curing may include using a chamber and plasma. In an implementation, hydrogen ($H_2$) and argon (Ar) may be used in passivation. Curing may cure an interlayer insulating film 120 damaged from passivation. In an implementation, oxygen ($O_2$) may be used in curing.

Referring to FIG. 40, part of a first capping pattern 331 may grow on the top surface of a filling film 115.

Referring to FIG. 41, the first capping pattern 331 may be formed using its different growth rates on a metal and a non-metal. The first capping pattern 331 may grow faster on a metal, and the first capping pattern 331 may be thicker on a gate electrode (113, 114, and 115) than on first spacers 111 and second spacers 112.

The first capping pattern 331 may be in contact (e.g., direct contact) with an interlayer insulating film 120.

The first capping pattern 331 may be formed by, e.g., atomic layer deposition (ALD), chemical vapor deposition (CVD), or sputtering.

Referring to FIG. 42, a second capping pattern 332 may be formed on the first capping pattern 331. The second capping pattern 332 may fill a third recess T3. Thereafter, the steps illustrated in FIGS. 24 through 26 may be performed.

Figure 43:
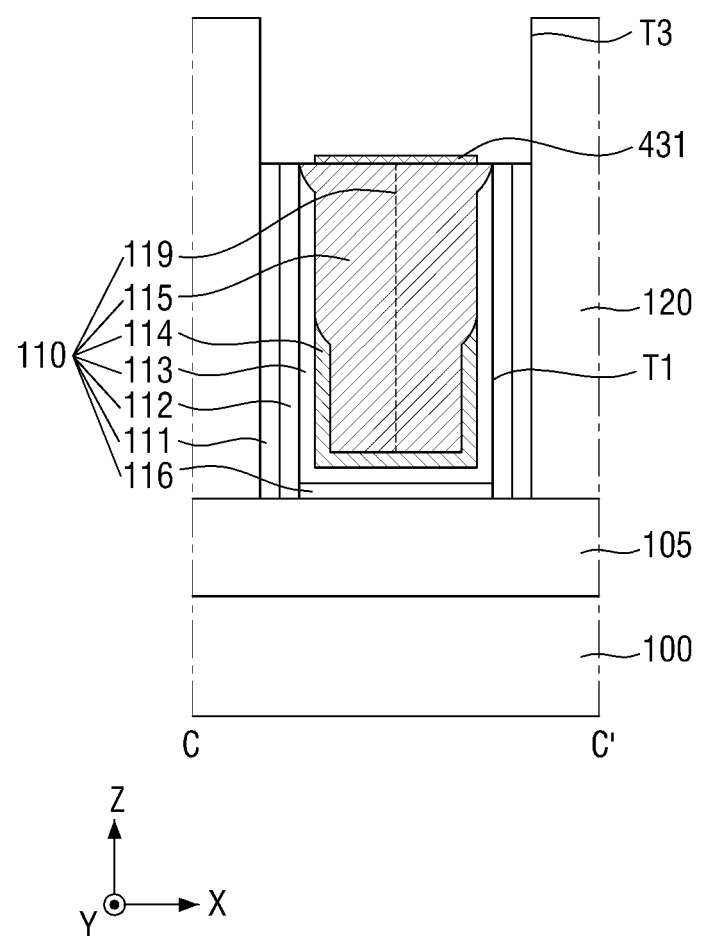
FIGS. 43 through 45 are cross-sectional views of stages in a method of fabricating a semiconductor device according to some embodiments of the present disclosure.
Figure 44:
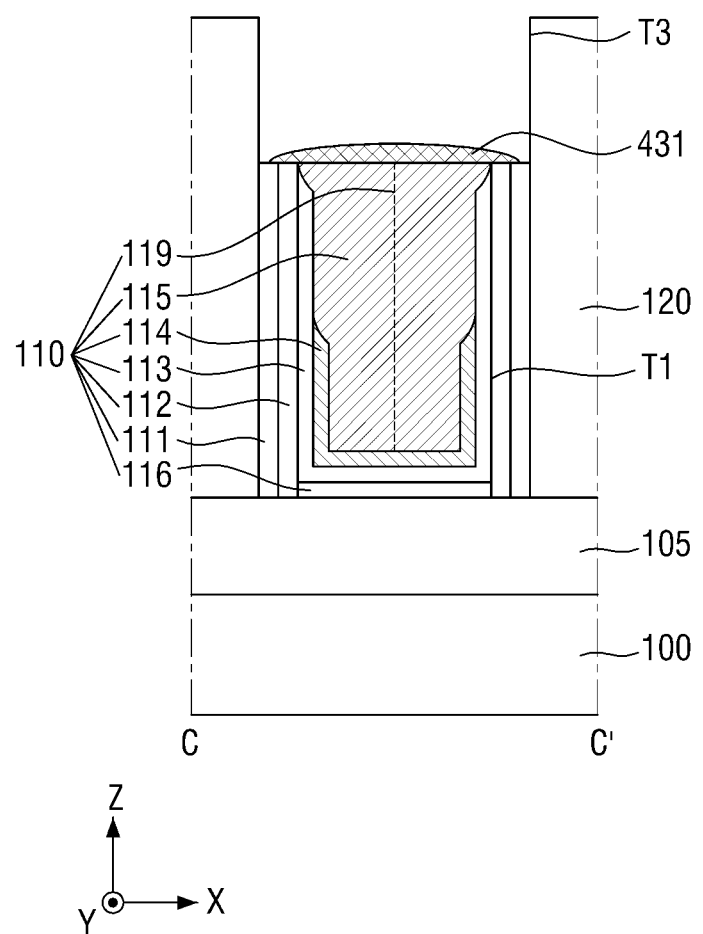
Figure 45:
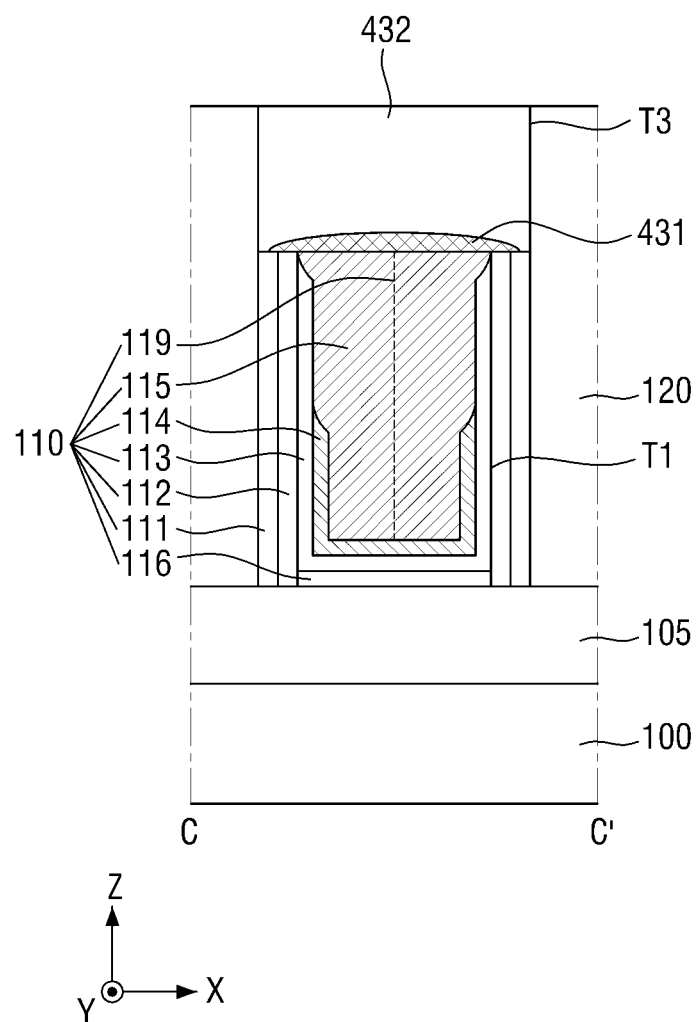

FIGS. 43 through 45 are cross-sectional views of stages in a method of fabricating a semiconductor device according to some embodiments of the present disclosure.

Referring to FIG. 43, after the steps illustrated in FIGS. 16 through 21, passivation and curing may be performed. The performing of passivation and curing may include using a chamber and plasma. In an implementation, hydrogen ($H_2$) and argon (Ar) may be used in passivation. Curing may cure an interlayer insulating film 120 damaged from passivation. In an implementation, oxygen ($O_2$) may be used in curing.

Referring to FIG. 43, part of a first capping pattern 431 may grow on the top surface of a filling film 115.

Referring to FIG. 44, the first capping pattern 431 may be formed using its different growth rates on a metal and a non-metal. The first capping pattern 431 may grow faster on a metal, and the first capping pattern 431 may be thicker on a gate electrode (113, 114, and 115) than on first spacers 111 and second spacers 112.

The first capping pattern 431 may not be in contact with an interlayer insulating film 120.

The first capping pattern 431 may be formed by, e.g., atomic layer deposition (ALD), chemical vapor deposition (CVD), or sputtering.

Referring to FIG. 45, a second capping pattern 432 may be formed on the first capping pattern 431. The second capping pattern 432 may be in contact (e.g., direct contact) with the first spacers 111 or the second spacers 112. The second capping pattern 432 may fill a third recess T3. Thereafter, the steps illustrated in FIGS. 24 through 26 may be performed.

FIGS. 46 through 50 are cross-sectional views of stages in a method of fabricating a semiconductor device according to some embodiments of the present disclosure.

Figure 46:
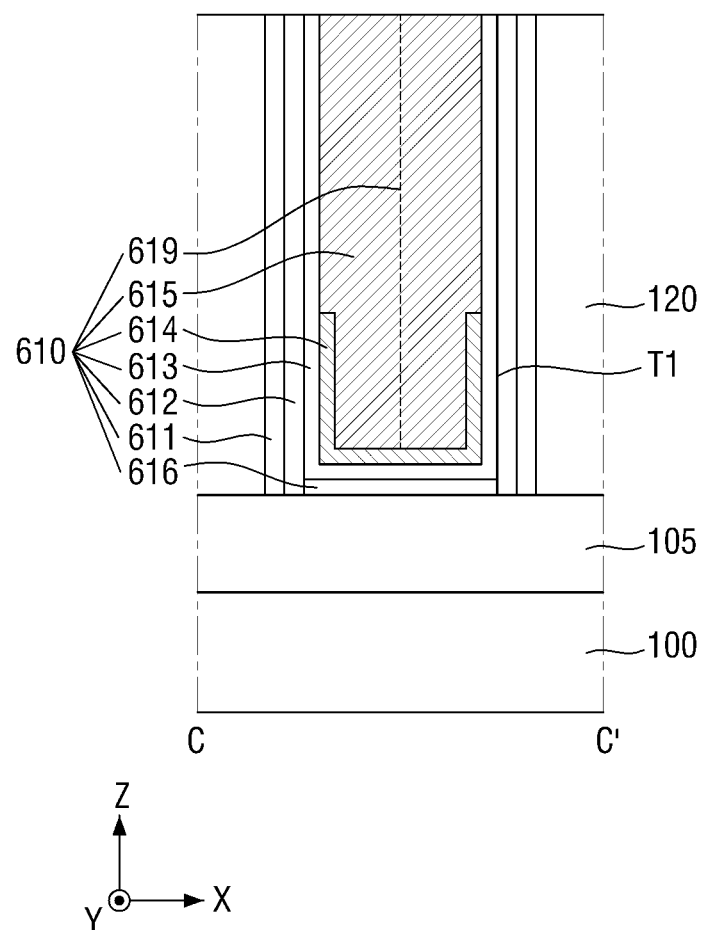
FIGS. 46 through 50 are cross-sectional views of stages in a method of fabricating a semiconductor device according to some embodiments of the present disclosure.

Referring to FIG. 46, after the stages illustrated in FIGS. 17 and 18, a first interface film 616, a metal film 614, and a filling film 615 may be sequentially stacked on a substrate 100.

In an implementation, the first interface film 616 may be formed at the bottom of a first recess T1, and the gate insulating film 613 may be formed on the first interface film 616, the sidewalls of the first recess T1, the top surfaces of the first spacers 611, and the top surface of an interlayer insulating film 120.

The metal film 614, which may include silicon (Si), may be formed along the profile of part of the gate insulating film 613, or the metal film 614 may be formed along the profile of the entire gate insulating film 613.

The metal film 614 may be formed by, e.g., atomic layer deposition (ALD), chemical vapor deposition (CVD), or sputtering.

Thereafter, parts of the gate insulating film 613 and the filling film 615 may be removed so that the top surfaces of the first spacers 611, the second spacers 612, the gate insulating film 613, and the filling film 615 may fall on the same plane through planarization or etching. In this case, the gate insulating film 613 and the filling film 615 may be provided in the form of a pre-gate electrode.

Figure 47:
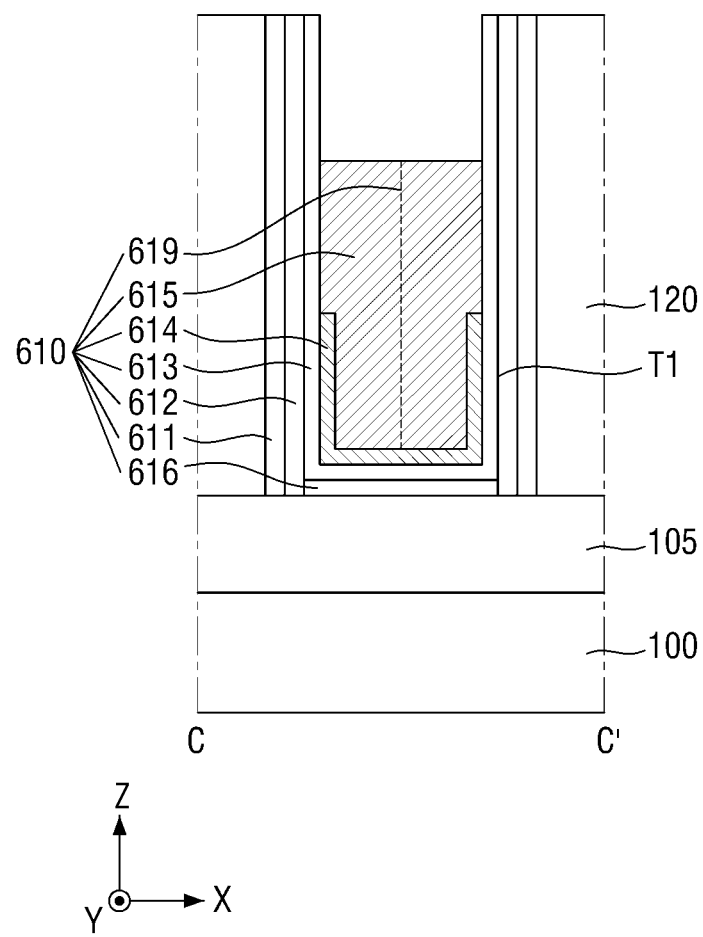

Referring to FIG. 47, part of the filling film 615 may be removed. As a result, the top surface of the filling film 615 may become lower than the top surfaces of the first spacers 611, the second spacers 612, the gate insulating film 613, and the interlayer insulating film 120.

If in the step illustrated in FIG. 46, the top surface of the metal film 614 is on level with the top surface of the filling film 615, the metal film 614 and the filling film 615 may be removed together.

The removal of part of the filling film 615 may include, e.g., performing both wet etching and dry etching and may use a mask pattern.

Figure 48:
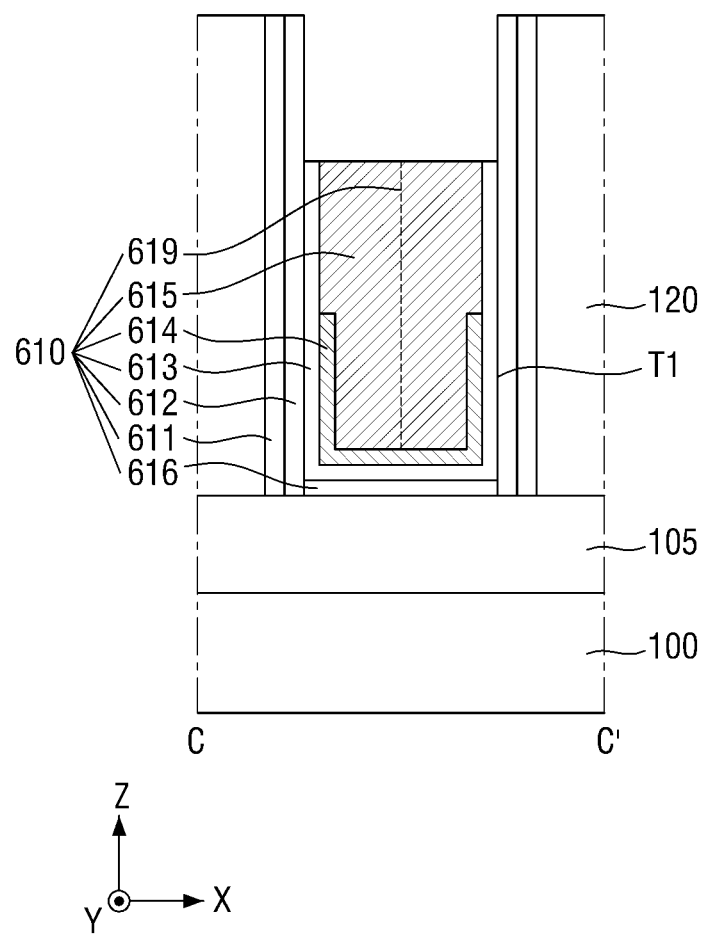
Figure 49:
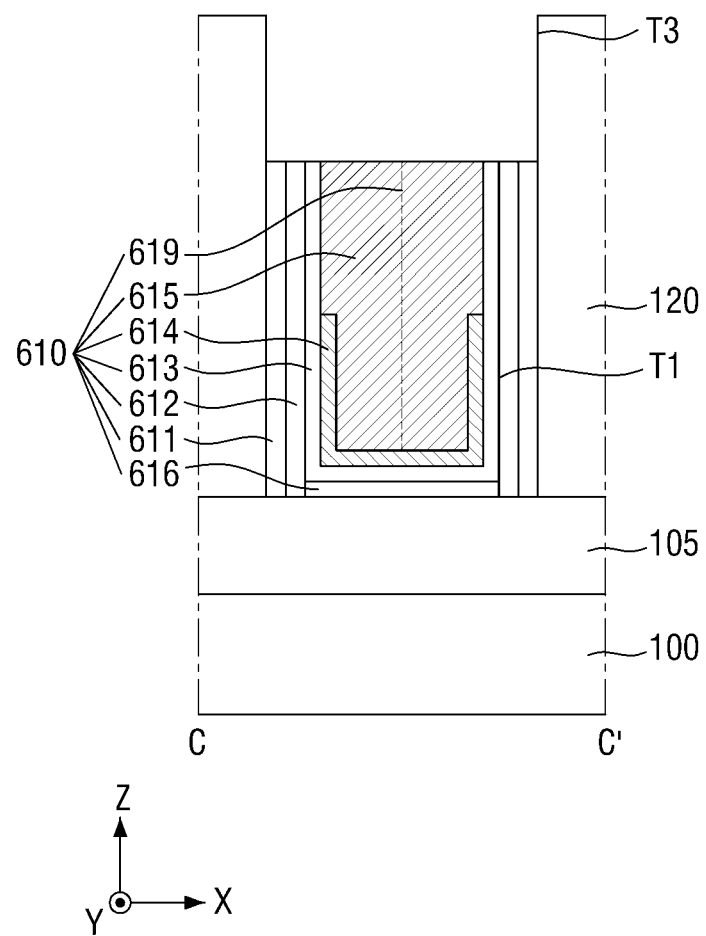

Referring to FIGS. 48 and 49, parts of the gate insulating film 613, the first spacers 611, and the second spacers 612 may be removed. As a result, the top surfaces of the gate insulating film 613, the first spacers 611, and the second spacers 612 may become lower than the top surface of the interlayer insulating film 120, and the top surfaces of the first spacers 611, the second spacers 612, the gate insulating film 613, and the filling film 615 may all fall on the same plane.

The removal of parts of the gate insulating 613, the first spacers 611, and the second spacers 612 may include, e.g., performing both wet etching and dry etching and may use a mask pattern.

Figure 50:
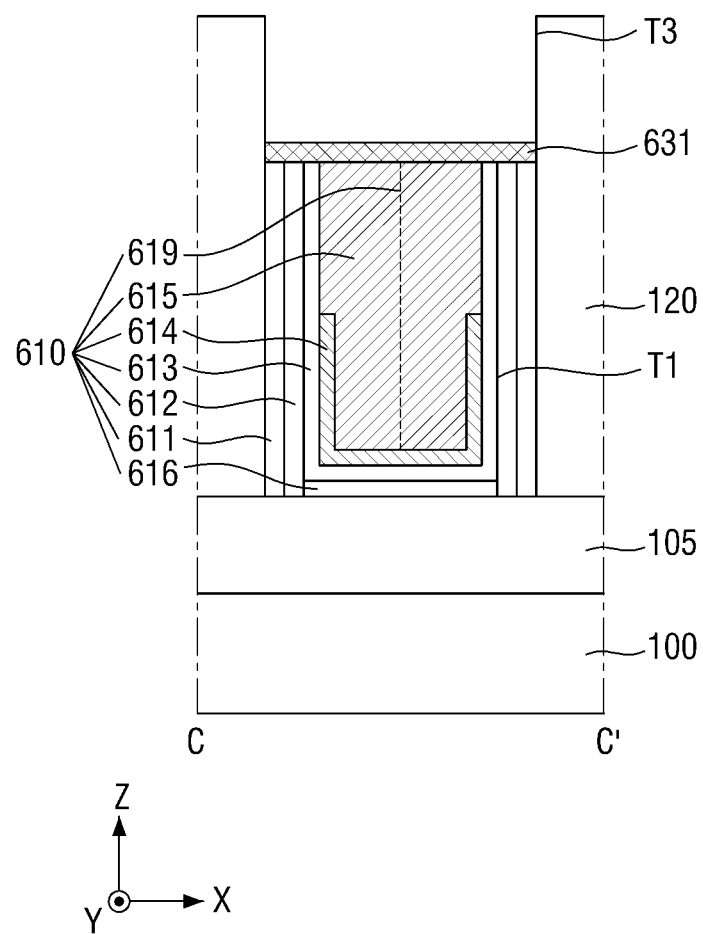

Referring to FIG. 50, a first capping pattern 631 may be formed on a gate structure 610. The first capping pattern 631 may be formed conformally along the bottom of a third recess T3. Thereafter, the steps illustrated in FIGS. 23 through 26 may be performed.

By way of summation and review, as semiconductor devices have become highly integrated and the length of channels has decreased, seams may be formed near gate metal filling films.

During etching for forming gate contacts after the formation of metal gates, lower gate metal regions may be exposed due to silicon nitrides being etched. If chemicals were to penetrate through metal seams during wet etching, work function metals could be lost. Such loss may occur below gate contacts, and when metal gates are lost, the operating voltage of transistors may shift to 100 mV to 130 mV, leading to the loss of the parameters of semiconductor devices and decreases in yield.

It may be helpful to prevent the penetration of chemicals through metal seams.

One or more embodiments may provide a semiconductor device with improved parameter yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a fin-type pattern extending in a first direction;
a gate electrode extending in a second direction over the fin-type pattern, the second direction being different from the first direction;
nanosheets surrounded by the gate electrode;
outer spacers on sidewalls of the gate electrode;
a capping structure on the gate electrode and the outer spacers, the capping structure including a first capping pattern and a second capping pattern, the second capping pattern being on the first capping pattern; and
an interlayer insulating film surrounding sidewalls of each of the outer spacers and sidewalls and an uppermost surface of the capping structure,
wherein:
the first capping pattern includes a conductive material, and
the second capping pattern includes an insulating material.
2. The semiconductor device as claimed in claim 1, wherein an uppermost surface of the second capping pattern is in contact with the interlayer insulating film.
3. The semiconductor device as claimed in claim 1, wherein sidewalls of the first capping pattern and the second capping pattern are in contact with the interlayer insulating film.
4. The semiconductor device as claimed in claim 1, wherein a part of the first capping pattern extends between the second capping pattern and the interlayer insulating film.
5. The semiconductor device as claimed in claim 1, wherein the first capping pattern is in contact with uppermost surfaces of the outer spacers.
6. The semiconductor device as claimed in claim 1, wherein the second capping pattern is not in contact with sidewalls of the first capping pattern.
7. The semiconductor device as claimed in claim 1, wherein the gate electrode includes a seam structure.
8. The semiconductor device as claimed in claim 1, further comprising source/drain regions on the fin-type pattern and on sides of the nanosheets.
9. The semiconductor device as claimed in claim 8, further comprising inner spacers sequentially arranged on sides of the source/drain regions.
10. A semiconductor device, comprising:
a fin-type pattern extending in a first direction;
a gate electrode extending in a second direction over the fin-type pattern, the second direction being different from the first direction;
nanosheets surrounded by the gate electrode;
spacers on sidewalls of the gate electrode;
a capping structure on the gate electrode and the spacers, the capping structure including a first capping pattern and a second capping pattern, the second capping pattern being on the first capping pattern; and
an interlayer insulating film surrounding sidewalls of each of the spacers and sidewalls of the capping structure,
wherein the gate electrode includes a seam structure between the nanosheets and the capping structure.
11. The semiconductor device as claimed in claim 10, wherein:
the gate electrode further including a gate insulating film, a metal film, and a filling film on the sidewalls of the spacers, and
the filling film includes the seam structure.
12. The semiconductor device as claimed in claim 10, wherein sidewalls of the second capping pattern are in contact with the interlayer insulating film.
13. The semiconductor device as claimed in claim 10, further comprising a gate contact on the gate electrode, wherein:
the gate contact is in contact with an uppermost surface of the first capping pattern, and
the first capping pattern includes a same material as the gate electrode.
14. The semiconductor device as claimed in claim 10, wherein the second capping pattern covers an uppermost part of the first capping pattern.
15. The semiconductor device as claimed in claim 10, wherein an uppermost surface of the interlayer insulating film is at a position higher than an uppermost surface of the capping structure.
16. A semiconductor device, comprising:
nanosheets;
a gate electrode surrounding the nanosheets;
spacers on sidewalls of the gate electrode;
a capping structure on the gate electrode and the spacers, the capping structure including a first capping pattern and a second capping pattern, the second capping pattern being on the first capping pattern; and an interlayer insulating film surrounding sidewalls of each of the spacers and sidewalls of the capping structure, wherein the gate electrode includes a gate insulating film, a metal film, and a filling film on the sidewalls of the spacers, wherein the filling film includes a seam structure, and wherein an uppermost surface of the filling film is on a same plane as an uppermost surface of the spacers.

17. The semiconductor device as claimed in claim 16, wherein the first capping pattern and the second capping pattern are not in contact with sidewalls of the spacers.

18. The semiconductor device as claimed in claim 16, wherein the first capping pattern is formed conformally.

* * * * *